United States Patent
Tian et al.

(10) Patent No.: US 10,566,829 B2
(45) Date of Patent: Feb. 18, 2020

(54) ADAPTER AND CHARGING CONTROL METHOD

(71) Applicant: GUANGDONG OPPO MOBILE TELECOMMUNICATIONS CORP., LTD., Dongguan (CN)

(72) Inventors: Chen Tian, Dongguan (CN); Jialiang Zhang, Dongguan (CN)

(73) Assignee: GUANGDONG OPPO MOBILE TELECOMMUNICATIONS CORP., LTD., Dongguan, Guangdong (CN)

( * ) Notice: Subject to any disclaimer, the term of this patent is extended or adjusted under 35 U.S.C. 154(b) by 0 days.

(21) Appl. No.: 15/575,788

(22) PCT Filed: Jan. 7, 2017

(86) PCT No.: PCT/CN2017/070548
§ 371 (c)(1),
(2) Date: Nov. 20, 2017

(87) PCT Pub. No.: WO2017/133402
PCT Pub. Date: Aug. 10, 2017

(65) Prior Publication Data
US 2018/0145533 A1    May 24, 2018

Related U.S. Application Data

(63) Continuation-in-part of application No. PCT/CN2016/073679, filed on Feb. 5, 2016.

(30) Foreign Application Priority Data

Jul. 26, 2016  (CN) .......................... 2016 1 0600612

(51) Int. Cl.
*H02J 7/06* (2006.01)
*H02J 7/02* (2016.01)
(Continued)

(52) U.S. Cl.
CPC .......... *H02J 7/027* (2013.01); *G01R 31/3842* (2019.01); *H01M 10/0525* (2013.01);
(Continued)

(58) Field of Classification Search
CPC ........ H02J 7/027; H02J 7/0029; H02J 7/0031; H02J 7/0052; H02J 7/007; H02J 7/008;
(Continued)

(56) References Cited

U.S. PATENT DOCUMENTS

| | | | |
|---|---|---|---|
| 4,087,733 A | 5/1978 | Casagrande | |
| 6,025,695 A | 2/2000 | Friel et al. | |

(Continued)

FOREIGN PATENT DOCUMENTS

| | | |
|---|---|---|
| CN | 1525619 A | 9/2004 |
| CN | 1564421 A | 1/2005 |

(Continued)

OTHER PUBLICATIONS

Australian Patent Application No. 2016291545 Office Action dated Jun. 25, 2018, 6 pages.
(Continued)

*Primary Examiner* — Zixuan Zhou
(74) *Attorney, Agent, or Firm* — Lathrop Gage LLP

(57) ABSTRACT

An adapter and a charging control method are provided, the adapter includes a power conversion unit, a voltage feedback unit, a current feedback unit and a power adjusting unit. An input end of the power adjusting unit is coupled to an output end of the voltage feedback unit and an output end of the current feedback unit respectively, and an output end of the power adjusting unit is coupled to the power conversion unit. The power adjusting unit is configured to receive a voltage feedback signal and a current feedback signal, and to stabilize the output voltage and the output current of the adapter when the voltage feedback signal indicates that the
(Continued)

output voltage of the adapter reaches a predetermined target voltage or when the current feedback signal indicates that the output current of the adapter reaches a predetermined target current.

16 Claims, 14 Drawing Sheets

(51) Int. Cl.
| | |
|---|---|
| G01R 31/3842 | (2019.01) |
| H02M 3/335 | (2006.01) |
| H02J 7/00 | (2006.01) |
| H02J 7/04 | (2006.01) |
| H02M 7/217 | (2006.01) |
| H02M 1/08 | (2006.01) |
| H02M 7/06 | (2006.01) |
| H01M 10/0525 | (2010.01) |
| H01M 10/42 | (2006.01) |
| H01M 10/44 | (2006.01) |
| H02M 1/44 | (2007.01) |
| H02M 5/04 | (2006.01) |
| H02M 7/04 | (2006.01) |
| H02M 1/00 | (2006.01) |
| H02J 7/10 | (2006.01) |

(52) U.S. Cl.
CPC ......... *H01M 10/425* (2013.01); *H01M 10/44* (2013.01); *H02J 7/007* (2013.01); *H02J 7/008* (2013.01); *H02J 7/0029* (2013.01); *H02J 7/0031* (2013.01); *H02J 7/0052* (2013.01); *H02J 7/0093* (2013.01); *H02J 7/022* (2013.01); *H02J 7/04* (2013.01); *H02J 7/041* (2013.01); *H02J 7/045* (2013.01); *H02J 7/047* (2013.01); *H02J 7/06* (2013.01); *H02M 1/08* (2013.01); *H02M 1/44* (2013.01); *H02M 3/335* (2013.01); *H02M 3/33507* (2013.01); *H02M 3/33523* (2013.01); *H02M 3/33569* (2013.01); *H02M 3/33576* (2013.01); *H02M 3/33592* (2013.01); *H02M 5/04* (2013.01); *H02M 7/04* (2013.01); *H02M 7/06* (2013.01); *H02M 7/217* (2013.01); *H01M 2010/4271* (2013.01); *H02J 2007/0039* (2013.01); *H02J 2007/0059* (2013.01); *H02J 2007/0062* (2013.01); *H02J 2007/0096* (2013.01); *H02J 2007/0098* (2013.01); *H02J 2007/10* (2013.01); *H02M 2001/0009* (2013.01)

(58) Field of Classification Search
CPC .. H02J 7/0093; H02J 7/022; H02J 7/04; H02J 7/041; H02J 7/045; H02J 7/047; H02J 7/06; G01R 31/3842; H01M 10/0525; H01M 10/425; H01M 10/44; H02M 1/08; H02M 1/44; H02M 3/335; H02M 3/33507; H02M 3/33523; H02M 3/33569; H02M 3/33576; H02M 3/33592; H02M 5/04; H02M 7/04; H02M 7/06; H02M 7/217
USPC ........................................................ 320/164
See application file for complete search history.

(56) References Cited

U.S. PATENT DOCUMENTS

| | | | |
|---|---|---|---|
| 6,137,265 | A | 10/2000 | Cummings et al. |
| 6,909,617 | B1 | 6/2005 | Mirskiy |
| 7,750,604 | B2 | 7/2010 | Hartular et al. |
| 2004/0090209 | A1 | 5/2004 | Nishida et al. |
| 2006/0284595 | A1 | 12/2006 | Hsieh et al. |
| 2008/0197811 | A1* | 8/2008 | Hartular ................ H01M 10/44 320/141 |
| 2013/0069585 | A1* | 3/2013 | Kamata .................. H02J 5/005 320/108 |
| 2013/0141034 | A1 | 6/2013 | Huang et al. |
| 2015/0130417 | A1 | 5/2015 | Song et al. |
| 2015/0180356 | A1* | 6/2015 | Norisada ........... H02M 3/33546 363/17 |
| 2015/0295441 | A1* | 10/2015 | Winger ................ H02J 7/0052 320/107 |
| 2016/0064977 | A1* | 3/2016 | Chen ..................... H02J 7/0052 320/114 |

FOREIGN PATENT DOCUMENTS

| | | |
|---|---|---|
| CN | 1578055 A | 2/2005 |
| CN | 202026118 U | 11/2011 |
| CN | 102545360 A | 7/2012 |
| CN | 102801340 A | 11/2012 |
| CN | 102364856 B | 10/2013 |
| CN | 103730937 A | 4/2014 |
| CN | 103762702 A | 4/2014 |
| CN | 103795040 A | 5/2014 |
| CN | 104810873 A | 7/2015 |
| CN | 104810877 A | 7/2015 |
| CN | 104810879 A | 7/2015 |
| CN | 104917271 A | 9/2015 |
| CN | 104967199 A | 10/2015 |
| CN | 104967201 A | 10/2015 |
| CN | 105098900 A | 11/2015 |
| CN | 105098945 A | 11/2015 |
| EP | 2887492 A2 | 6/2015 |
| EP | 2930589 A1 | 10/2015 |
| EP | 2980958 A1 | 2/2016 |
| JP | H08223907 A | 8/1996 |
| JP | 2007049869 A | 2/2007 |
| JP | 2009200053 A | 9/2009 |
| JP | 2013198262 A | 9/2013 |
| JP | 5454781 B2 | 3/2014 |
| JP | 2015006068 A | 1/2015 |
| JP | 2015162967 A | 9/2015 |
| JP | 5822304 B2 | 11/2015 |
| JP | 2017508437 A | 3/2017 |
| TW | 200616305 A | 5/2006 |
| TW | M481439 U | 7/2014 |
| WO | WO 2012167677 A1 | 12/2012 |
| WO | WO 2015113341 A1 | 8/2015 |
| WO | WO 2015113349 A1 | 8/2015 |
| WO | WO 2015138880 A1 | 9/2015 |

OTHER PUBLICATIONS

European Patent Application No. 16819788.7 extended Search and Opinion dated Nov. 15, 2017, 7 pages.
Korean Patent Application No. 20177002310 Office Action dated Jan. 29, 2018, 5 pages.
Korean Patent Application No. 20177002310 English translation of Office Action dated Jan. 29, 2018, 3 pages.
Korean Patent Application No. 20177002310 Office Action dated Jun. 26, 2018, 3 pages.
Korean Patent Application No. 20177002310 English translation of Office Action dated Jun. 26, 2018, 3 pages.
Singapore Patent Application No. 11201700428U Search and Opinion dated Nov. 23, 2017, 9 pages.
Taiwan Patent Application No. 105120040 Office Action dated Aug. 8, 2017, 11 pages.
Taiwan Patent Application No. 105120040 Decision to Grant Patent dated Mar. 22, 2018, 2 pages.
PCT/CN2016/073679 International Search Report and Written Opinion dated Nov. 10, 2016, 12 pages.
PCT/CN2016/073679 English translation of International Search Report and Written Opinion dated Nov. 10, 2016, 8 pages.
Chen, Liang-Rui, 'A Design of an Optimal Battery Pulse Charge System by Frequency-Varied Technique', IEEE Transactions on

(56) References Cited

OTHER PUBLICATIONS

Industrial Electronics, vol. 54, No. 1, Feb. 2007, pp. 398-405, cited in office action in AU application No. 2016291545.
European Patent Application No. 17746722.2 extended Search and Opinion dated Jun. 12, 2018, 10 pages.
PCT/CN2017/070548 International Search Report and Written Opinion dated Aug. 24, 2017, 12 pp.
PCT/CN2017/070548 English Translation of the International Search Report and Written Opinion dated Aug. 24, 2017, 7 pp.
Taiwan Patent Application No. 106124355, Office Action dated Oct. 8, 2018, 4 pages.
Japanese Patent Application No. 2018-500630, Office Action dated Aug. 14, 2018, 6 pages.
Japanese Patent Application No. 2018-500630, English translation of Office Action dated August 14, 2018, 4 pages.
Japanese Patent Application No. 2018-500630, English translation of Decision to Grant a Patent dated Feb. 12, 2019, 3 pages.
Japanese Patent Application No. 2018-500630, Decision to Grant a Patent dated Feb. 12, 2019, 3 pages.
European Patent Application No. 17746722.2, Office Action dated Mar. 14, 2019, 6 pages.
Indian Patent Application No. 201737043643, Office Action dated Nov. 30, 2019, 6 pages.

\* cited by examiner

ADAPTER AND CHARGING CONTROL METHOD

CROSS-REFERENCE TO RELATED APPLICATIONS

This application is a US national phase application of International Application No. PCT/CN2017/070548, filed on Jan. 7, 2017, which is based on and claims priority to and benefits of International Application No. PCT/CN2016/073679 filed on Feb. 5, 2016 and Chinese Patent Application Serial No. 201610600612.3 filed on Jul. 26, 2016, the entire contents of which are incorporated herein by reference.

FIELD

Embodiments of the present disclosure generally relates to charging technical field, and more particularly, to an adapter, and a charging control method.

BACKGROUND

An adapter, also called as a power adapter, is configured to charge a device to be charged (such as a terminal). Nowadays, the adapter on the market typically charges the device to be charged (such as the terminal) in a constant voltage mode. When a current absorbed by the device to be charged (such as the terminal) is larger than a maximum output current that the adapter can provide, it may cause the adapter to enter an overload protection state, and thus the adapter cannot continue charging the device to be charged (such as the terminal).

DISCLOSURE

Embodiments of the present disclosure provide an adapter and a charging control method, which may improve safety of charging process.

In a first aspect, an adapter is provided. The adapter includes: a power conversion unit, configured to convert an input alternating current to obtain an output voltage and an output current of the adapter; a voltage feedback unit, in which an input end of the voltage feedback unit is coupled to the power conversion unit, and the voltage feedback unit is configured to detect the output voltage of the adapter to generate a voltage feedback signal, in which the voltage feedback signal is configured to indicate whether the output voltage of the adapter reaches a predetermined target voltage; a current feedback unit, in which an input end of the current feedback unit is coupled to the power conversion unit, and the current feedback unit is configured to detect the output current of the adapter to generate a current feedback signal, in which the current feedback signal is configured to indicate whether the output current of the adapter reaches a predetermined target current; a power adjusting unit, in which an input end of the power adjusting unit is coupled to an output end of the voltage feedback unit and an output end of the current feedback unit respectively, an output end of the power adjusting unit is coupled to the power conversion unit, the power adjusting unit is configured to receive the voltage feedback signal and the current feedback signal, and to stabilize the output voltage and the output current of the adapter when the voltage feedback signal indicates that the output voltage of the adapter reaches the target voltage or when the current feedback signal indicates that the output current of the adapter reaches the target current; and a charging interface, in which the adapter is configured to perform a bidirectional communication with the device to be charged via a data wire of the charging interface.

In a second aspect, a charging control method is provided. The method is applied in an adapter. The method includes: converting an input alternating current to obtain an output voltage and an output current of the adapter; detecting the output voltage of the adapter to generate a voltage feedback signal, in which the voltage feedback signal is configured to indicate whether the output voltage of the adapter reaches a predetermined target voltage; detecting the output current of the adapter to generate a current feedback signal, in which the current feedback signal is configured to indicate whether the output current of the adapter reaches a predetermined target current; stabilizing the output voltage and the output current of the adapter when the voltage feedback signal indicates that the output voltage of the adapter reaches the target voltage or when the current feedback signal indicates that the output current of the adapter reaches the target current; performing a bidirectional communication with the device to be charged via a data wire of a charging interface.

According to embodiments of the present disclosure, the adapter includes both the voltage feedback unit and the current feedback unit, in which the voltage feedback unit, the power adjusting unit and the power conversion unit form a hardware circuit configured to perform closed-loop control on the output voltage of the adapter, that is, a voltage feedback loop in a hardware form; the current feedback unit, the power adjusting unit and the power conversion unit form a hardware circuit configured to perform closed-loop control on the output current of the adapter, that is, a current feedback loop in a hardware form. Based on a double-loop feedback control, the power adjusting unit according to embodiments of the present disclosure may comprehensively consider feedback information provided by the voltage feedback signal and the current feedback signal, and stabilize the output voltage and output current of the adapter when any one of the output voltage and the output current of the adapter reaches a target value. In other words, according to embodiments of the present disclosure, when any one of the output voltage and the output current of the adapter reaches the target value, the power adjusting unit can immediately sense occurrence of this event, and respond to this event immediately, to stabilize the output voltage and the output current of the adapter, improving safety of charging process.

BRIEF DESCRIPTION OF THE DRAWINGS

In order to illustrate the technical solutions of embodiments of the present disclosure more clearly, the accompanying drawings used in the description of embodiments of the present disclosure are briefly described hereunder. Obviously, the described drawings are merely some embodiments of present disclosure. For those skilled in the art, other drawings may be obtained based on these drawings without any creative work.

EMBODIMENTS OF THE PRESENT DISCLOSURE

Figure 1A:
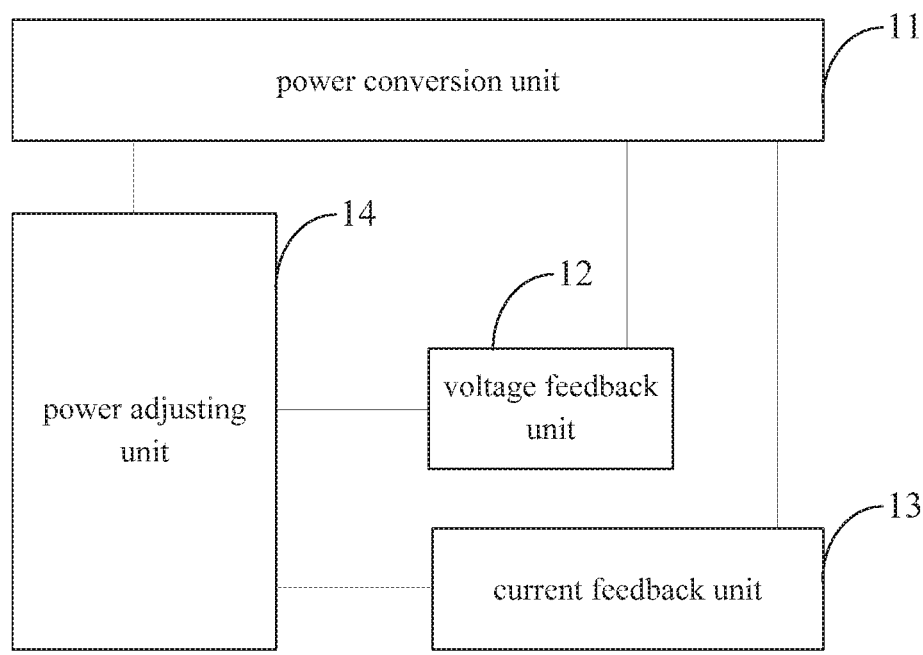
FIG. 1A is a schematic diagram of a second adapter according to an embodiment of the present disclosure.

The technical solutions in embodiments of the present disclosure are hereinafter described clearly and completely with reference to the accompanying drawings in embodiments of the present disclosure. It should be understood that, embodiments described herein are a part of embodiments of the present disclosure, but not all. Based on embodiments of the present disclosure, all other embodiments obtained by those skilled in the art without creative work should fall within the scope of the present disclosure.

In the related art, a first adapter configured to charge a device to be charged (such as a terminal) is presented. The first adapter is suitable for working in a constant voltage mode. In the constant voltage mode, a voltage output by the first adapter is basically constant, such as 5V, 9V, 12V or 20V, etc.

The voltage output by the first adapter is unsuitable for being directly applied to both ends of a battery. It is required to convert the voltage by a conversion circuit in the device to be charged (such as the terminal) to obtain a charging voltage and/or a charging current expected by the battery in the device to be charged (such as the terminal).

The conversion circuit is configured to convert the voltage output by the first adapter, so as to meet requirements for the charging voltage and/or the charging current expected by the battery.

As an example, the conversion circuit may be a charging management module, such as a charging integrated circuit (IC). During a process of charging the battery, the conversion circuit may be configured to manage the charging voltage and/or the charging current of the battery. The conversion circuit has a voltage feedback function and/or a current feedback function, so as to realize management on the charging voltage and/or the charging current of the battery.

For example, the process of charging the battery may include at least one of a trickle charging stage, a constant current charging stage and a constant voltage charging stage. In the trickle charging stage, the conversion circuit may be configured to utilize a current feedback loop to ensure that current flowing into the battery in the trickle charging stage meets the charging current (such as a first charging current) expected by the battery. In the constant current charging stage, the conversion circuit may be configured to utilize a current feedback loop to ensure that current flowing into the battery in the constant current charging stage meets the charging current (such as a second charging current, which may be greater than the first charging current) expected by the battery. In the constant voltage charging stage, the conversion circuit may be configured to utilize a voltage feedback loop to ensure that voltage applied to both ends of the battery in the constant voltage charging stage meets the charging voltage expected by the battery.

As an example, when the voltage output by the first adapter is greater than the charging voltage expected by the battery, the conversion circuit may be configured to perform a buck conversion on the voltage output by the first adapter, such that a buck-converted voltage meets the requirement of the charging voltage expected by the battery. As another example, when the voltage output by the first adapter is less than the charging voltage expected by the battery, the conversion circuit may be configured to perform a boost conversion on the voltage output by the first adapter, such that a boost-converted voltage meets the requirement of the charging voltage expected by the battery.

As another example, assume that the first adapter outputs a constant voltage of 5V. When the battery includes a single battery cell (such as a lithium battery cell, a charging cut-off voltage of the single battery cell is 4.2V), the conversion circuit (for example, a buck circuit) may perform the buck conversion on the voltage output by the first adapter, such that the charging voltage obtained after the buck conversion meets the requirement of the charging voltage expected by the battery.

As yet another example, assume that the first adapter outputs a constant voltage of 5V. When the first adapter charges two or more battery cells (such as a lithium battery cell, a charging cut-off voltage of the single battery cell is 4.2V) coupled in series, the conversion circuit (for example, a boost circuit) may perform the boost conversion on the voltage output by the first adapter, such that the charging voltage obtained after the boost conversion meets the requirement of the charging voltage expected by the battery.

Limited by a poor conversion efficiency of the conversion circuit, a part of electric energy is lost in a form of heat, and this part of heat may gather inside the device to be charged (such as the terminal). A design space and a space for heat dissipation of the device to be charged (such as the terminal) are small (for example, a physical size of a mobile terminal used by a user becomes thinner and thinner, while plenty of electronic components are densely arranged in the mobile terminal to improve a performance of the mobile terminal), which not only increases a difficulty in designing the conversion circuit, but also results in that it is hard to dissipate the heat gathered in the device to be charged (such as the terminal) in time, thus further causing an abnormity of the device to be charged (such as the terminal).

For example, heat gathered on the conversion circuit may cause a thermal interference on electronic components neighboring the conversion circuit, thus causing abnormal operations of the electronic components. For another example, heat gathered on the conversion circuit may shorten service lifespan of the conversion circuit and neighboring electronic components. For yet another example, heat gathered on the conversion circuit may cause a thermal interference on the battery, thus causing abnormal charging and discharging of the battery. For still another example, heat gathered on the conversion circuit may increase a temperature of the device to be charged (such as the terminal), thus affecting user experience during the charging. For still yet another example, heat gathered on the conversion circuit may short-circuit the conversion circuit, such that the voltage output by the first adapter is directly applied to both ends of the battery, thus causing over-voltage charging of the battery, which even brings safety hazard, for example, the battery may explode, if the over-voltage charging lasts for a long time period.

Embodiments of the present disclosure provide a second adapter, an output voltage of which is adjustable. The second adapter may obtain status information of the battery. The status information of the battery may include electric quantity information and/or voltage information of the battery. The second adapter may adjust the voltage output by itself according to the obtained status information of the battery, to meet the requirement of the charging voltage and/or the charging current expected by the battery. Further, during the constant current charging stage of the battery charging process, the voltage output by the second adapter after the adjustment may be directly applied to both ends of the battery for charging the battery.

The second adapter may have a voltage feedback function and/or a current feedback function, so as to realize management on the charging voltage and/or the charging current of the battery.

In some embodiments, the second adapter may adjust the voltage output by itself according to the obtained status information of the battery as follows. The second adapter may obtain the status information of the battery in real time, and adjust the voltage output by itself according to the status information of the battery obtained in real time, to meet the charging voltage and/or the charging current expected by the battery.

The second adapter may adjust the voltage output by itself according to the status information of the battery obtained in real time as follows. With the increasing of the voltage of the battery during the charging process, the second adapter may obtain status information of the battery at different time points in the charging process, and adjust the voltage output by itself in real time according to the status information of the battery, to meet the requirement of the charging voltage and/or the charging current expected by the battery.

For example, the process of charging the battery may include at least one of a trickle charging stage, a constant current charging stage and a constant voltage charging stage. In the trickle charging stage, the second adapter may be configured to utilize the current feedback loop to ensure that the current output by the second adapter and flowing into the battery in the trickle charging stage meets the requirement of the charging current expected by the battery (such as the first charging current). In the constant current charging stage, the second adapter may be configured to utilize the current feedback loop to ensure that the current output by the second adapter and flowing into the battery in the constant current charging stage meets the requirement of the charging current expected by the battery (such as the second charging current, the second charging current may be greater than the first charging current). Moreover, in the constant current charging stage, the charging voltage output by the second adapter may be directly applied to both ends of the battery for charging the battery. In the constant voltage charging stage, the second adapter may be configured to utilize the voltage feedback loop to ensure that voltage output by the second adapter meets the requirement for charging voltage expected by the battery.

In the trickle charging stage and the constant voltage charging stage, the voltage output by the second adapter may be processed in the same manner as the first adapter, i.e., the voltage is converted by the conversion circuit in the device to be charged (such as the terminal) to obtain the charging voltage and/or the charging current expected by the battery in the device to be charged (such as the terminal).

As an implementation, in some embodiments, the current feedback loop of the second adapter may be implemented by software based on the voltage feedback loop. In detail, when the charging current output by the second adapter does not meet requirements, the second adapter may calculate an expected charging voltage according to an expected charging current, and the charging voltage output by the second adapter is adjusted to the calculated expected charging voltage via the voltage feedback loop, which is equivalent to realizing the current feedback function by software with the aid of the voltage feedback loop. However, in a process of charging the battery in a constant voltage mode, a load current in a charging circuit often changes rapidly. If the second adapter realizes the current feedback loop by software, it is required to perform intermediate operations such as current sampling, and current and voltage conversion, which results in that a response speed of the second adapter with respect to the load current is slow. Therefore, the current absorbed by the device to be charged (such as the terminal) is larger than a maximum output current that the second adapter can provide, which may cause the second adapter to enter an overload protection state, and thus the second adapter cannot continue charging the device to be charged (such as the terminal).

In order to improve the response speed of the second adapter with respect to the load current, a voltage feedback loop in a hardware form and a current feedback loop in a hardware form may be provided in the second adapter, which is described in detail with reference to FIG. 1A.

FIG. 1A is a schematic diagram of a second adapter according to an embodiment of the present disclosure. The second adapter 10 in FIG. 1A may include a power conversion unit 11, a voltage feedback unit 12, a current feedback unit 13, and a power adjusting unit 14.

The power conversion unit 11 is configured to convert an input alternating current to obtain an output voltage and an output current of the second adapter 10.

An input end of the voltage feedback unit 12 is coupled to the power conversion unit 11. The voltage feedback unit 12 is configured to detect the output voltage of the second adapter 10 to generate a voltage feedback signal. The voltage feedback signal is configured to indicate whether the output voltage of the second adapter 10 reaches a predetermined target voltage.

An input end of the current feedback unit 13 is coupled to the power conversion unit 11. The current feedback unit 13 is configured to detect the output current of the second adapter 10 to generate a current feedback signal. The current feedback signal is configured to indicate whether the output current of the second adapter 10 reaches a predetermined target current.

An input end of the power adjusting unit 14 is coupled to an output end of the voltage feedback unit 12 and an output end of the current feedback unit 13 respectively. An output end of the power adjusting unit 14 is coupled to the power conversion unit 11. The power adjusting unit 14 is configured to receive the voltage feedback signal and the current feedback signal, and to stabilize the output voltage and the output current of the second adapter 10 when the voltage feedback signal indicates that the output voltage of the second adapter 10 reaches the target voltage or when the current feedback signal indicates that the output current of the second adapter 10 reaches the target current.

The power adjusting unit 14 may stabilize the output voltage and the output current of the second adapter 10 as follows. The power adjusting unit 14 controls the output voltage and the output current of the second adapter 10 to remain constant. For example, assume that the power adjusting unit 14 is based on pulse width modulation (PWM for short). The output voltage and the output current of the second adapter 10 can be stabilized in a case where a frequency and a duty ratio of the PWM control signal remain constant.

According to embodiments of the present disclosure, the second adapter includes both the voltage feedback unit and the current feedback unit, in which the voltage feedback unit, the power adjusting unit and the power conversion unit form a hardware circuit configured to perform closed-loop control on the output voltage of the second adapter, that is, a voltage feedback loop in a hardware form; the current feedback unit, the power adjusting unit and the power conversion unit form a hardware circuit configured to perform closed-loop control on the output current of the second adapter, that is, a current feedback loop in a hardware form. Based on a double-loop feedback control, the power adjusting unit according to embodiments of the present disclosure may comprehensively consider feedback information provided by the voltage feedback signal and the current feedback signal, and stabilize the output voltage and output current of the second adapter when any one of the output voltage and the output current of the second adapter reaches a target value. In other words, according to embodiments of the present disclosure, when any one of the output voltage and the output current of the second adapter reaches the target value, the power adjusting unit can immediately sense occurrence of this event, and respond to this event immediately, to stabilize the output voltage and the output current of the second adapter, improving safety of charging process.

Taking the constant voltage mode as an example, the voltage feedback loop is mainly responsible for adjusting the output voltage of the second adapter to a voltage corresponding to the constant voltage mode, and the current feedback loop may be responsible for detecting whether the output current of the second adapter reaches the target current (in this case, the target current may be a maximum current that is able to be outputted in the constant voltage mode). Once the output current of the second adapter reaches the target current, the power adjusting unit can immediately sense this event via the current feedback loop, and stabilize the output current of the second adapter in time to prevent further increasing of the output current of the second adapter. Similarly, in a constant current mode, the current feedback loop can be responsible for adjusting the output current of the second adapter to a current corresponding to the constant current mode, and the voltage feedback loop may be responsible for detecting whether the output voltage of the second adapter reaches the target voltage (in this case, the target voltage may be a maximum voltage that is able to be outputted in the constant current mode). Once the output voltage of the second adapter reaches the target voltage, the power adjusting unit can immediately sense this event via the voltage feedback loop, and stabilize the output voltage of the second adapter in time to prevent further increasing of the output voltage of the second adapter.

The voltage feedback signal and the current feedback signal are configured to indicate different feedback objects, and are not intended to limit signal types of the voltage feedback signal and the current feedback signal. In detail, the voltage feedback signal may be configured to feedback the output voltage of the second adapter, the current feedback signal may be configured to feedback the output current of the second adapter, while both the voltage feedback signal and the current feedback signal may be a voltage signal.

The target voltage may be a preset fixed value, or it may be an adjustable variable. In some embodiments, the second adapter 10 may adjust a value of the target voltage via a certain adjusting circuit according to actual demand. For example, the device to be charged (such as the terminal) may send an instruction for adjusting the target voltage to the second adapter. The second adapter 10 adjusts the value of the target voltage according to the instruction for adjusting the target voltage. For another example, the second adapter 10 may receive status information of the battery from the device to be charged and adjust the value of the target voltage in real time according to the status information of the battery. Similarly, the target current may be a preset fixed value, or it may be an adjustable variable. In some embodiments, the second adapter 10 may adjust a value of the target current via a certain adjusting circuit according to actual demand. For example, the device to be charged (such as the terminal) may send an instruction for adjusting the target current to the second adapter 10. The second adapter 10 adjusts the value of the target current according to the instruction for adjusting the target current. For another example, the second adapter 10 may receive status information of the battery from the device to be charged and adjust the value of the target current in real time according to the status information of the battery.

The device to be charged applied in embodiments of the present disclosure may be a "communication terminal" (or "terminal" for short). The device to be charged includes, but is not limited to a device configured to receive/transmit communication signals via wired connection (for example, public switched telephone network (PSTN), digital subscriber line (DSL), digital cable, direct cable connection and/or another data connection/network) and/or via a wireless interface (for example, cellular network, wireless local area network (WLAN), digital TV network such as digital video broadcasting handheld (DVB-H) network, satellite network, an amplitude modulation-frequency modulation (AM-FM) broadcasting transmitter, and/or a wireless interface of another communication terminal). The communication terminal configured to communicate via the wireless interface may be referred to as "wireless communication terminal", "wireless terminal" and/or "mobile terminal". Examples of the mobile terminal include, but are not limited to a satellite phone or a cell phone, a terminal combining a cell radio phone and a personal communication system (PCS) having capability of data process, fax, and data communication, a personal digital assistant (PDA) including a radio phone, a pager, an Internet/Intranet access, a web browser, a notepad & address book, a calendar and/or a global positioning system (GPS) receiver, and a common laptop and/or handheld receiver, or other electronic devices including a radio phone transceiver.

In some embodiments, the second adapter 10 may include a control unit (referring to the MCU in FIG. 23) configured to control a charging process, such that intelligence degree of the second adapter 10 is improved. In detail, the control unit may be configured to perform bidirectional communication with the device to be charged (such as the terminal) to obtain an instruction or status information (i.e., the status information may be information such as present voltage of the battery in the device to be charged and/or temperature of the device to be charged) from the device to be charged (such as the terminal), such that a charging process that the second adapter 10 charges the device to be charged (such as the terminal) is controlled based on the instruction or status information of the device to be charged (such as the terminal). In some embodiments, the control unit may be a microcontroller unit (MCU for short), but the embodiments of the present disclosure are not limited thereto. The control unit may also be other types of chip or circuit.

Figure 19A:
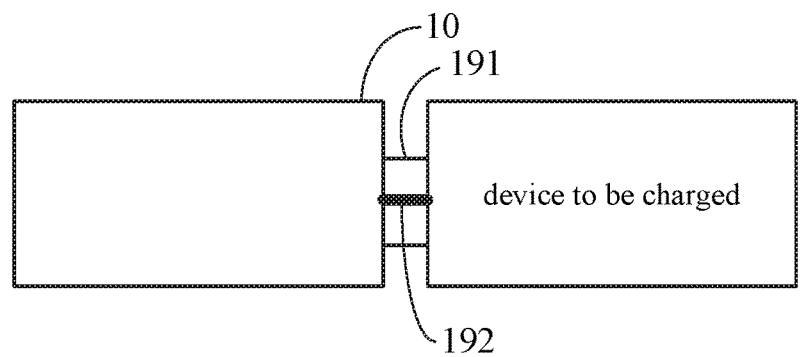
FIG. 19A is a schematic diagram illustrating a connection between a device to be charged and a second adapter according to an embodiment of the present disclosure.

In some embodiments, the second adapter 10 may include a charging interface (referring to the charging interface 191 in FIG. 19A). However, a type of the charging interface is not particularly limited in embodiments of the present disclosure. For example, the charging interface may be a universal serial bus (USB) interface, which may be a common USB interface or a micro USB interface, or a Type-C interface.

A charging mode or function of the second adapter 10 is related to selection of the target voltage and the target current. The values of the target voltage and the target current may be different when the charging mode or function of the second adapter 10 is different. The constant voltage mode and the constant current mode are taken as an example respectively for detail description in the following.

In some embodiments, the second adapter 10 supports a first charging mode, that is, the second adapter 10 can charge the device to be charged (such as the terminal) operating in the first charging mode. The first charging mode is the constant voltage mode. In the constant voltage mode, the target voltage of the second adapter 10 is the voltage corresponding to the constant voltage mode. The target current is the maximum current that the second adapter 10 is able to output in the constant voltage mode. The power adjusting unit 14 is configured to adjust the output voltage of the second adapter 10 to the voltage corresponding to the constant voltage mode according the voltage feedback signal, and to control the output current of the second adapter 10 to be not greater than the maximum current that the second adapter 10 is able to output in the constant voltage mode when the current feedback signal indicates that the output current of the second adapter 10 reaches the maximum current that the second adapter 10 is able to output in the constant voltage mode.

In the constant voltage mode, the output voltage of the second adapter 10 may be adjusted to a fixed voltage value. The voltage corresponding to the constant voltage mode in the above is the fixed voltage value. For example, in the constant voltage mode, if the output voltage of the second adapter 10 is 5V, the voltage corresponding to the constant voltage mode is 5V.

According to embodiments of the present disclosure, the target voltage is set to be the voltage corresponding to the constant voltage mode, and the target current is set to be the maximum current that the second adapter is able to output in the constant voltage mode. In this way, the second adapter can adjust the output voltage of the second adapter to the voltage corresponding to the constant voltage mode quickly based on the voltage feedback loop, and perform constant voltage charging on the device to be charged (such as the terminal). In a constant voltage charging process, once the output current (load current) of the second adapter reaches the maximum current that the second adapter is able to output, the second adapter can sense this situation in time via the current feedback loop, and prevent further increasing of the output current of the second adapter in time, thus avoiding charge fault, and improving a response ability of the second adapter with respect to the load current.

For example, in the constant voltage mode, if the fixed voltage value corresponding to the constant voltage mode is 5V, the output current of the second adapter usually maintains between 100 mA and 200 mA. In this case, the target voltage may be set as the fixed voltage value (such as 5V), and the target current may be set as 500 mA or 1 A. Once the output current of the second adapter increases to the current value corresponding to the target current, the power adjusting unit 14 can sense this event immediately via the current feedback loop, and prevent further increasing of the output current of the second adapter.

Figure 1B:
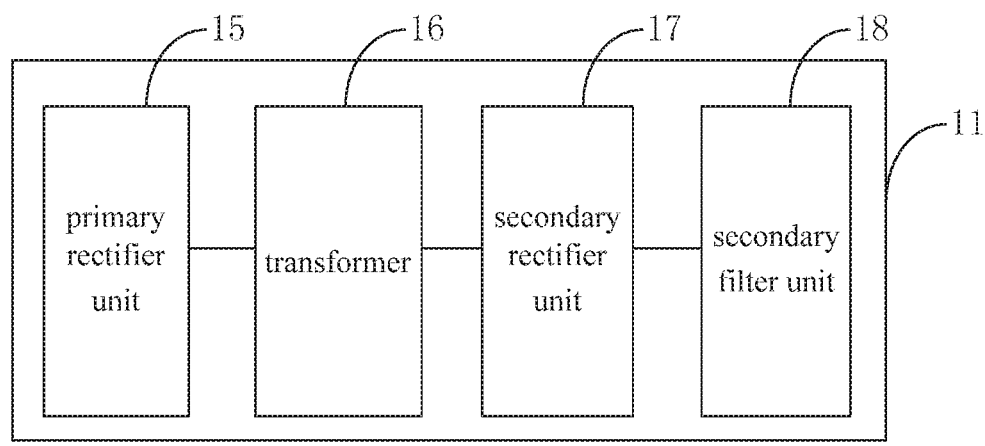
FIG. 1B is a schematic diagram of a power conversion unit according to an embodiment of the present disclosure.

As illustrated in FIG. 1B, based on above embodiments, the power conversion unit 11 may include a primary rectifier unit 15, a transformer 16, a secondary rectifier unit 17, and a secondary filter unit 18. The primary rectifier unit 15 is configured to output a voltage with a pulsating waveform to the transformer 16 directly.

In the related art, the power conversion unit includes a rectifier unit and a filter unit at a secondary side as well as a rectifier unit and a filter unit at a primary side. The rectifier unit and the filter unit at the primary side may be called as a primary rectifier unit and a primary filter unit respectively. The rectifier unit and the filter unit at the secondary side may be called as a secondary rectifier unit and a secondary filter unit respectively. The primary filter unit generally uses liquid aluminum electrolytic capacitor for filtering. A size of the liquid aluminum electrolytic capacitor is large, which may lead to a large size of the adapter.

In embodiments of the present disclosure, the power conversion unit 11 includes a primary rectifier unit 15, a transformer 16, a secondary rectifier unit 17, and a secondary filter unit 18. The primary rectifier unit 15 is configured to output a voltage with a pulsating waveform to the transformer 16 directly. In other words, the power conversion unit 11 provided in the embodiments of the present disclosure does not include the primary filter unit, so that the size of the second adapter 10 can be reduced to a great extent, making the second adapter 10 more portable. The secondary filter unit 18 mainly performs the filtering based on a solid aluminum electrolytic capacitor. After the primary filter unit is removed from the power conversion unit 11, although the solid aluminum electrolytic capacitor has a limited load capacity, it is possible to respond to change of the load current in time due to presence of the current feedback loop in the hardware form, thus avoiding the charge fault caused by too large output current of the second adapter.

In above solution in which the primary filter unit is removed, the maximum current that the second adapter 10 is able to output in the constant voltage mode may be determined based on a capacitance of a capacitor in the secondary filter unit. For example, if a maximum load current that the secondary filter unit can bear is determined to be 500 mA or 1 A based on the capacitance of the capacitor in the secondary filter unit, the target current may be set as 500 mA or 1 A, and thus it can avoid the charge fault caused by the output current of the second adapter larger than the target current.

In some embodiments, the second adapter 10 supports a second charging mode, that is, the second adapter 10 can charge the device to be charged (such as the terminal) operating in the second charging mode. The second charging mode is the constant current mode. In the constant current mode, the target voltage is the maximum voltage that the second adapter 10 is able to output in the constant current mode. The target current is the current corresponding to the constant current mode. The power adjusting unit 14 is configured to adjust the output current of the second adapter 10 to the current corresponding to the constant current mode according the current feedback signal, and to control the output voltage of the second adapter 10 to be not greater than the maximum voltage that the second adapter 10 is able to output in the constant current mode when the voltage feedback signal indicates that the output voltage of the second adapter 10 reaches the maximum voltage that the second adapter 10 is able to output in the constant current mode.

According to embodiments of the present disclosure, the target current is set to be the current corresponding to the constant current mode, and the target voltage is set to be the maximum voltage that the second adapter is able to output in the constant current mode. In this way, the second adapter can adjust the output current of the second adapter to the current corresponding to the constant current mode quickly based on the current feedback loop, and charge the device to be charged (such as the terminal). In a charging process, once the output voltage of the second adapter reaches the maximum voltage that the second adapter is able to output, the second adapter can sense this situation in time via the voltage feedback loop, and prevent further increasing of the output voltage of the second adapter in time, thus avoiding the charge fault.

Figure 2:
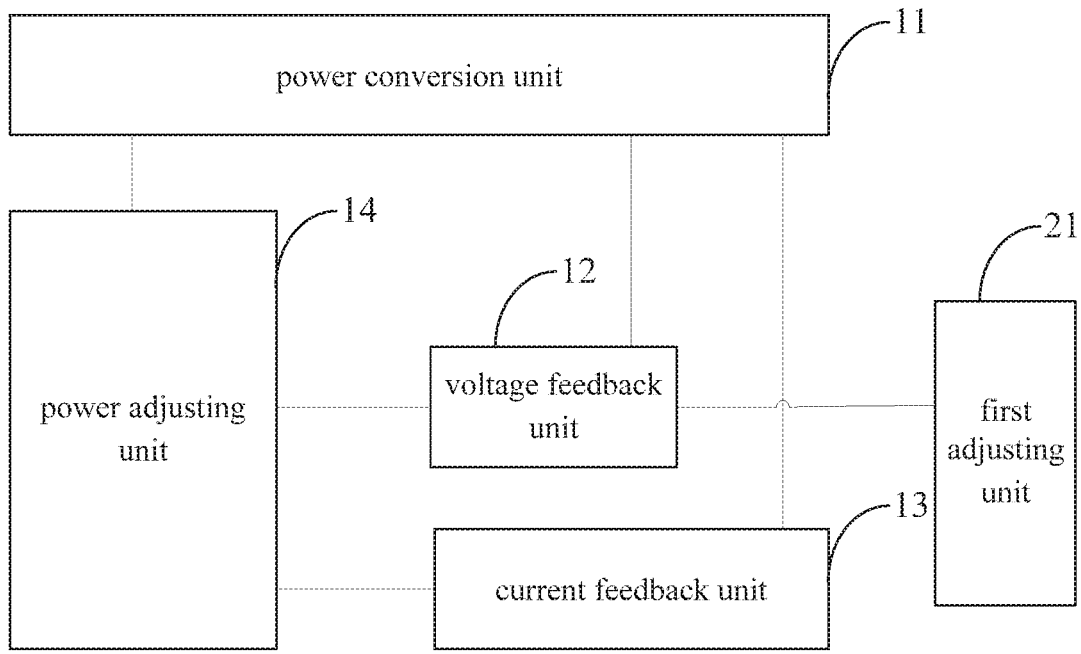
FIG. 2 is a schematic diagram of a second adapter according to another embodiment of the present disclosure.

As illustrated in FIG. 2, based on any one of above embodiments, the second adapter 10 may further include a first adjusting unit 21. The first adjusting unit 21 is coupled to the voltage feedback unit 12. The first adjusting unit 21 may be configured to adjust the value of the target voltage.

In embodiments of the present disclosure, the first adjusting unit is introduced, and the first adjusting unit can adjust the output voltage of the second adapter according to actual demand, improving the intelligence degree of the second adapter. For example, the second adapter 10 can operate in the first charging mode or the second charging mode, and the first adjusting unit 21 can adjust the value of the target voltage correspondingly based on the first charging mode or the second charging mode presently used by the second adapter 10.

Figure 3:
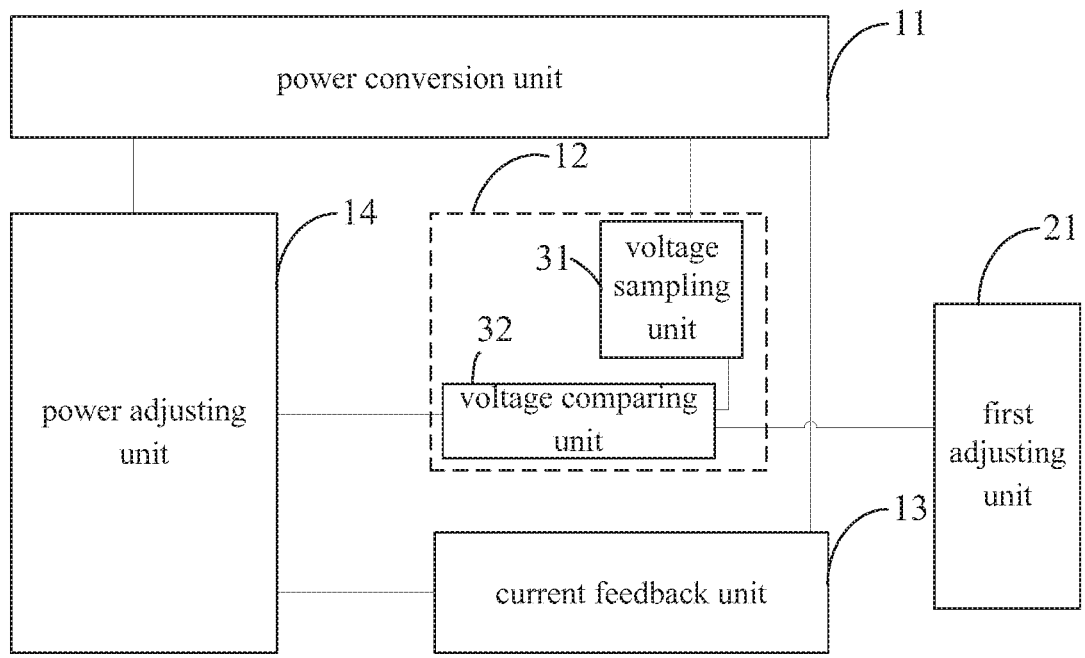
FIG. 3 is a schematic diagram of a second adapter according to yet another embodiment of the present disclosure.

Base on the embodiments illustrated in FIG. 2, as illustrated in FIG. 3, the voltage feedback unit 12 may include a voltage sampling unit 31 and a voltage comparing unit 32. An input end of the voltage sampling unit 31 is coupled to the power conversion unit 11. The voltage sampling unit 31 is configured to sample the output voltage of the second adapter 10 to obtain a first voltage. An input end of the voltage comparing unit 32 is coupled to an output end of the voltage sampling unit 31. The voltage comparing unit 32 is configured to compare the first voltage with a first reference voltage, and to generate the voltage feedback signal based on a result of comparing the first voltage with the first reference voltage. The first adjusting unit 21 is coupled to the voltage comparing unit 32, and is configured to provide the first reference voltage for the voltage comparing unit 32. The first adjusting unit 21 may realize adjusting the value of the target voltage by adjusting a value of the first reference voltage.

It should be understood that, the first voltage in embodiments of the present disclosure corresponds to the output voltage of the second adapter, or the first voltage is configured to indicate a voltage presently output by the second adapter. In addition, the first reference voltage in embodiments of the present disclosure corresponds to the target voltage, or the first reference voltage is configured to indicate a value of the target value.

In some embodiments, when the first voltage is less than the first reference voltage, the voltage comparing unit generates a first voltage feedback signal. The first voltage feedback signal is configured to indicate that the output voltage of the second adapter have not reached the target voltage. When the first voltage is equal to the first reference voltage, the voltage comparing unit generates a second voltage feedback signal. The second voltage feedback signal is configured to indicate that the output voltage of the second adapter reaches the target voltage.

Particular forms of the voltage sampling unit 31 are not limited in embodiments of the present disclosure. For example, the voltage sampling unit 31 may be one wire, at this time, the first voltage is the output voltage of the second adapter, and the first reference voltage is the target voltage. For another example, the voltage sampling unit 31 may include two resistors in series for voltage division, at this time, the first voltage may be a voltage obtained after the voltage division, and the first reference voltage is related to a division ratio of the two resistors. Assume that the target voltage is 5V, when the output voltage of the second adapter reaches 5V, and when the first voltage is 0.5V after the voltage division of the two resistors in series, the first reference voltage may be set as 0.5V.

There may be many ways for the first adjusting unit 21 in the embodiment illustrated in FIG. 3 to adjust the first reference voltage, which will be described in detail with reference to FIGS. 4-6 in the following.

Figure 4:
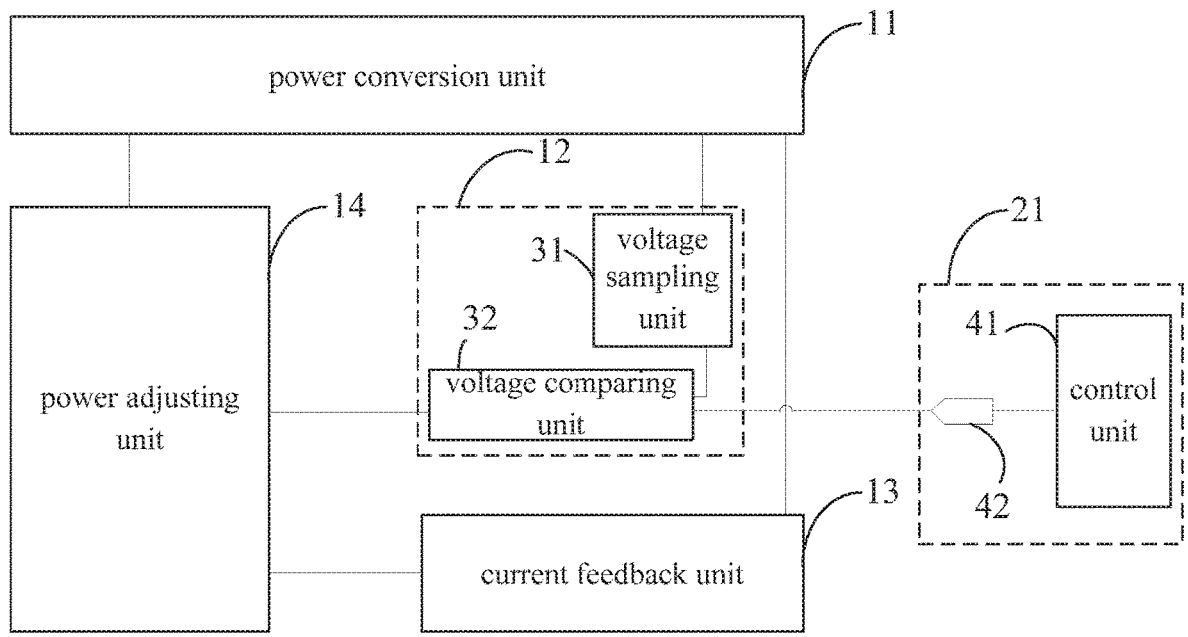
FIG. 4 is a schematic diagram of a second adapter according to yet another embodiment of the present disclosure.

In some embodiments, as illustrated in FIG. 4, the first adjusting unit 21 may include a control unit 41 and a first digital-to-analog converter (DAC for short) 42. An input end of the first DAC 42 is coupled to the control unit 41, and an output end of the first DAC 42 is coupled to the voltage comparing unit 32. The control unit 41 realizes adjusting the value of the first reference voltage via the first DAC 42.

In detail, the control unit 41 may be a MCU. The MCU may be coupled to the first DAC 42 via a DAC port. The MCU outputs a digital signal via the DAC port. The digital signal is converted to an analog signal by the first DAC 42. The analog signal is the value of the first reference voltage. The DAC has characteristics of high conversion speed and high accuracy, and thus a speed and an accuracy of the second adapter for adjusting and controlling the reference voltage are improved by adjusting the reference voltage with the DAC.

Figure 5:
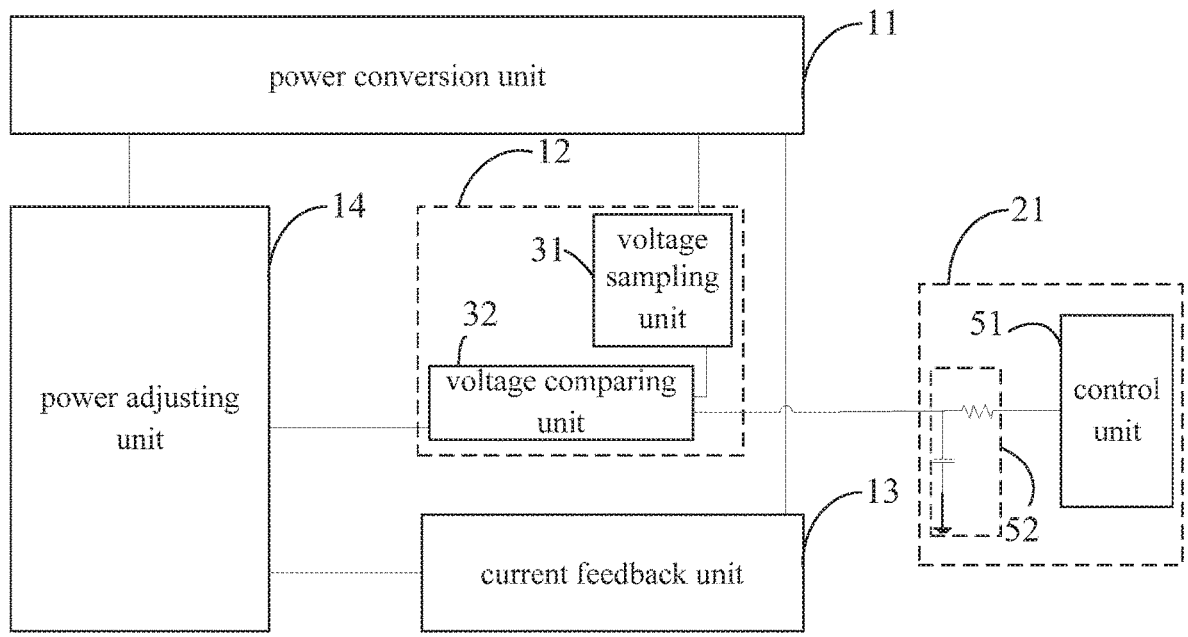
FIG. 5 is a schematic diagram of a second adapter according to yet another embodiment of the present disclosure.

In some embodiments, as illustrated in FIG. 5, the first adjusting unit 21 may include a control unit 51 and an RC filter unit 52. An input end of the RC filter unit 52 is coupled to the control unit 51, and an output end of the RC filter unit 52 is coupled to the voltage comparing unit 32. The control unit 51 is configured to generate a PWM signal, and to adjust the value of the first reference voltage by adjusting a duty ratio of the PWM signal.

In detail, the control unit 51 may be a MCU. The MCU may output the PWM signal via a PWM port. After the PWM signal is filtered by the RC filter unit 52, a stable analog quantity, i.e., the first reference voltage, is formed. The RC filter unit 52 has characteristics of being easy to implement and low price, and thus the first reference voltage can be adjusted with low cost.

Figure 6:
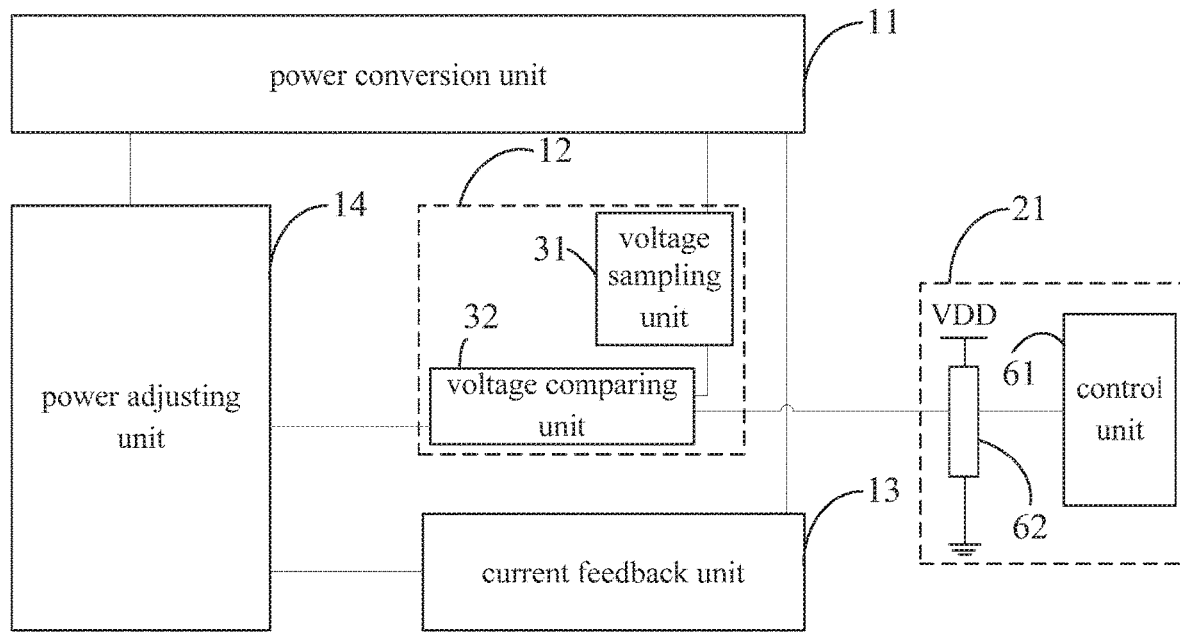
FIG. 6 is a schematic diagram of a second adapter according to yet another embodiment of the present disclosure.

In some embodiments, as illustrated in FIG. 6, the first adjusting unit 21 may include a control unit 61 and a digital potentiometer 62. A control end of the digital potentiometer 62 is coupled to the control unit 61, and an output end of the digital potentiometer 62 is coupled to the voltage comparing unit 32. The control unit 61 adjusts the value of the first reference voltage by adjusting a division ratio of the digital potentiometer 62.

In detail, the control unit 61 may be a MCU. The MCU may be coupled to the control end of the digital potentiometer 62 via an inter integrated circuit (I2C for short) interface, and configured to adjust the division ratio of the digital potentiometer 62. A high potential end of the digital potentiometer 62 may be VDD, i.e., a power end. A low potential end of the digital potentiometer 62 may be coupled to ground. An output end (or called as an adjusting output end) of the digital potentiometer 62 is coupled to the voltage comparing unit 32, and configured to output the first reference voltage to the voltage comparing unit 32. It is easy to implement the digital potentiometer 62 and the cost is low, thus realizing adjusting the first reference voltage with a low cost.

Figure 7:
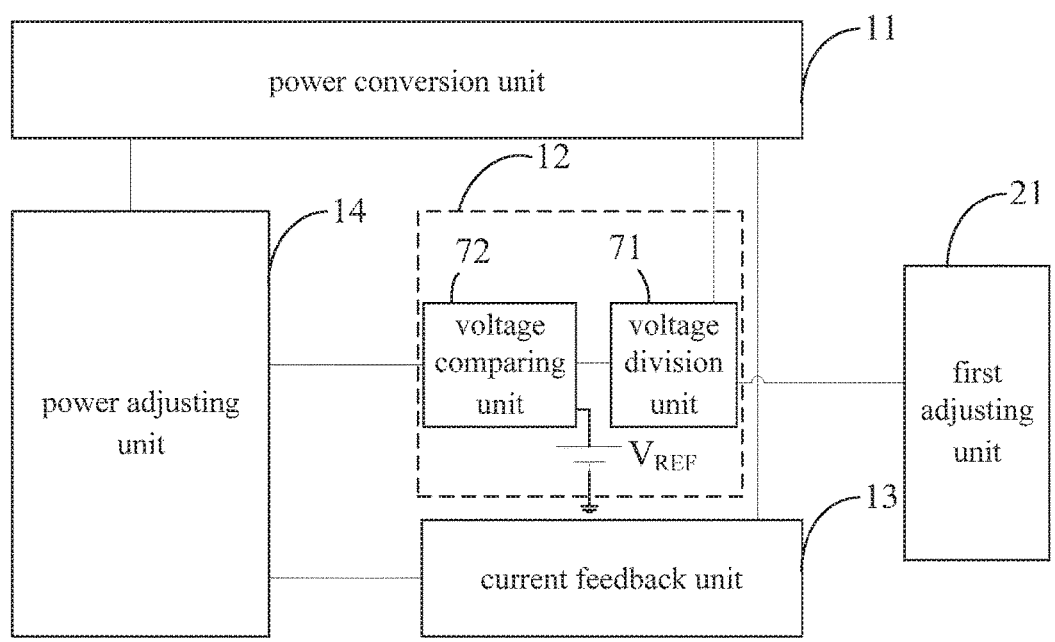
FIG. 7 is a schematic diagram of a second adapter according to yet another embodiment of the present disclosure.

Based on the embodiment illustrated in FIG. 2, as illustrated in FIG. 7, the voltage feedback unit 12 may include a voltage division unit 71 and a voltage comparing unit 72. An input end of the voltage division unit 71 is coupled to the power conversion unit 11. The voltage division unit 71 is configured to perform voltage division on the output voltage of the second adapter 10 according to a predetermined division ratio, to generate the first voltage. An input end of the voltage comparing unit 72 is coupled to an output end of the voltage division unit 71. The voltage comparing unit 72 is configured to compare the first voltage with the first reference voltage, and to generate the voltage feedback signal based on a result of comparing the first voltage with the first reference voltage. The first adjusting unit 21 is coupled to the voltage division unit 71, and adjusts the value of the target voltage by adjusting the division ratio of the voltage division unit 71.

A main difference between the embodiment illustrated in FIG. 7 and the embodiments illustrated in FIGS. 3-6 is as follows. Adjusting the value of the target voltage is realized by adjusting the reference voltage of the voltage comparing unit in the embodiments illustrated in FIGS. 3-6, while adjusting the value of the target voltage is realized by adjusting the division ratio of the voltage division unit 71 in the embodiment illustrated in FIG. 7. In other words, in the embodiment illustrated in FIG. 7, the first reference voltage may be set as a fixed value $V_{REF}$. If the output voltage of the second adapter is expected to be 5V, the division ratio of the voltage division unit 71 may be adjusted, so that a voltage at the output end of the voltage division unit 71 is equal to $V_{REF}$ when the output voltage of the second adapter is 5V. Similarly, if the output voltage of the second adapter is expected to be 3V, the division ratio of the voltage division unit 71 may be adjusted, so that the voltage at the output end of the voltage division unit 71 is equal to $V_{REF}$ when the output voltage of the second adapter is 3V.

In embodiments of the present disclosure, with the voltage division unit, sampling the output voltage of the second adapter and adjusting the value of the target voltage are realized, thus simplifying circuit structure of the second adapter.

There are many implementations of the voltage division unit 71 according to embodiments of the present disclosure. For example, the voltage division unit may be realized by a digital potentiometer, or above functions of voltage division and adjusting the division ratio may be realized through discrete elements such as resistors and switches.

Figure 8:
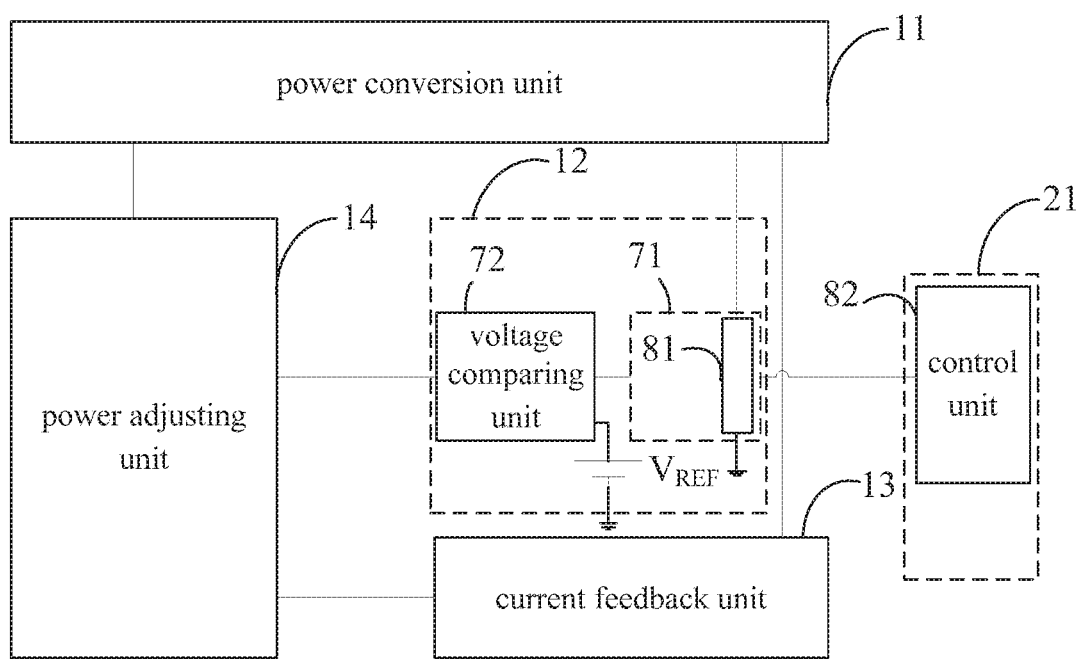
FIG. 8 is a schematic diagram of a second adapter according to yet another embodiment of the present disclosure.

Taking the digital potentiometer as an example, as illustrated in FIG. 8, the voltage division unit 71 may include a digital potentiometer 81, and the first adjusting unit 21 may include a control unit 82. A high potential end of the digital potentiometer 81 is coupled to the power conversion unit 11, and a low potential end of the digital potentiometer 81 is coupled to the ground. An output end of the digital potentiometer 81 is coupled to the input end of the voltage comparing unit 72. The control unit 82 is coupled to a control end of the digital potentiometer 81. The control unit 82 is configured to adjust the division ratio of the digital potentiometer 81.

Figure 9:
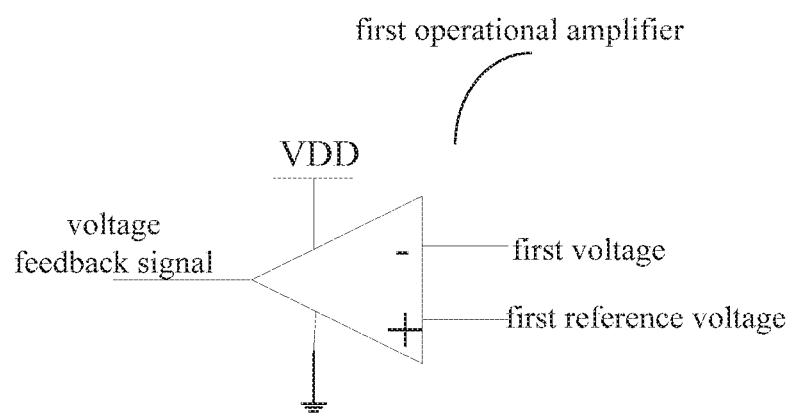
FIG. 9 is a schematic diagram of a voltage comparing unit according to an embodiment of the present disclosure.

There are many implementations of the voltage comparing unit 72. In some embodiments, as illustrated in FIG. 9, the voltage comparing unit 72 may include a first operational amplifier. An inverting input end of the first operational amplifier is configured to receive the first voltage, an in-phase input end of the first operational amplifier is configured to receive the first reference voltage, and an output end of the first operational amplifier is configured to generate the voltage feedback signal. The first operational amplifier may also be called as a first error amplifier, or a voltage error amplifier.

Figure 10:
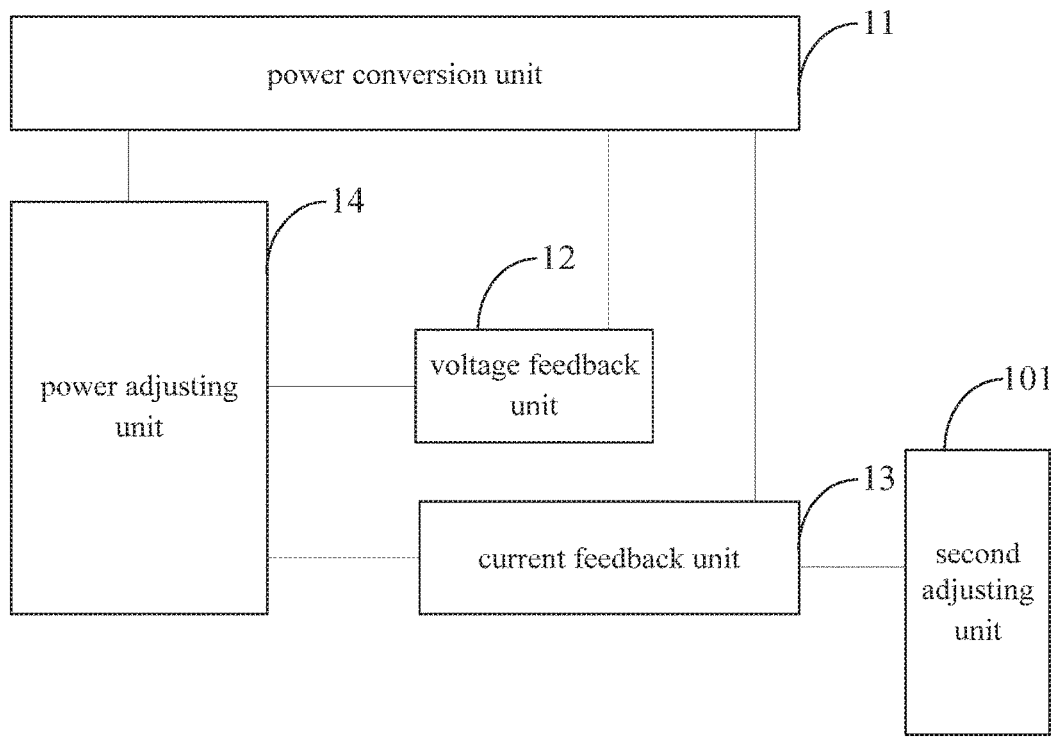
FIG. 10 is a schematic diagram of a second adapter according to yet another embodiment of the present disclosure.

As illustrated in FIG. 10, based on any one of above embodiments, the second adapter 10 may further include a second adjusting unit 101. The second adjusting unit 101 is coupled to the current feedback unit 13, and configured to adjust the value of the target current.

In embodiments of the present disclosure, the second adjusting unit is introduced, and the second adjusting unit can adjust the output current of the second adapter according to actual demand, improving the intelligence degree of the second adapter. For example, the second adapter 10 can operate in the first charging mode or the second charging mode, and the second adjusting unit 101 can adjust the value of the target current correspondingly based on the first charging mode or the second charging mode presently used by the second adapter 10.

Figure 11:
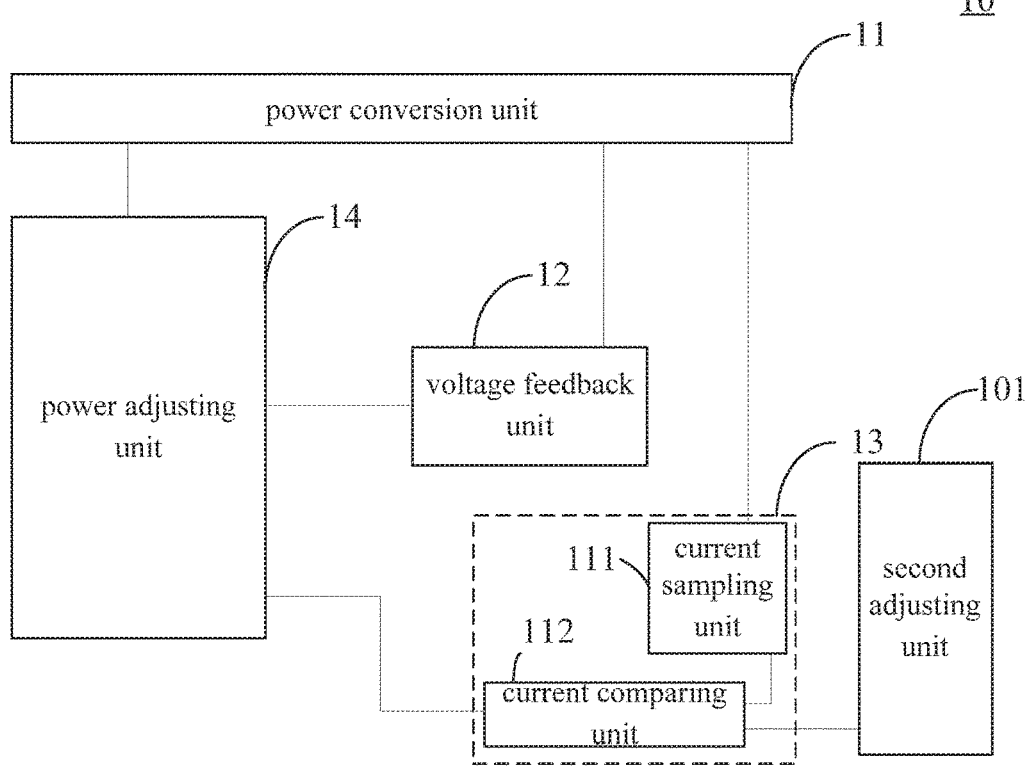
FIG. 11 is a schematic diagram of a second adapter according to yet another embodiment of the present disclosure.

In some embodiments, based on the embodiment illustrated in FIG. 10, as illustrated in FIG. 11, the current feedback unit 13 may include a current sampling unit 111 and a current comparing unit 112. An input end of the current sampling unit 111 is coupled to the power conversion unit 11. The current sampling unit 111 is configured to sample the output current of the second adapter 10 to obtain a second voltage. The second voltage is configured to indicate a magnitude of the output current of the second adapter 10. An input end of the current comparing unit 112 is coupled to an output end of the current sampling unit 111. The current comparing unit 112 is configured to compare the second voltage with a second reference voltage, and to generate the current feedback signal based on a result of comparing the second voltage with the second reference voltage. The second adjusting unit 101 is coupled to the current comparing unit 112, and configured to provide the second reference voltage for the current comparing unit 112, and to adjust the value of the target current by adjusting a value of the second reference voltage.

It should be understood that, the second voltage in embodiments of the present disclosure corresponds to the output current of the second adapter, or the second voltage is configured to indicate a size of the output current of the second adapter. In addition, the second reference voltage in embodiments of the present disclosure corresponds to the target current, or the second reference voltage is configured to indicate a size of the target current.

In detail, when the second voltage is less than the second reference voltage, the current comparing unit generates a first current feedback signal. The first current feedback signal is configured to indicate that the output current of the second adapter have not reached the target current. When the second voltage is equal to the second reference voltage, the current comparing unit generates a second current feedback signal. The second current feedback signal is configured to indicate that the output current of the second adapter reaches the target current.

The current sampling unit 111 may obtain the second voltage as follows. The current sampling unit 111 firstly samples the output current of the second adapter and obtains a sampling current. Then the current sampling unit 111 converts the sampling current into a corresponding sampling voltage (a value of the sampling voltage is equal to a product of the sampling current and a sampling resistance) according to a value of the sampling current. In some embodiments, the sampling voltage may be directly taken as the second voltage. In other embodiments, a plurality of resistors may be used for performing voltage division on the sampling voltage, and a voltage obtained after the voltage division is taken as the second voltage. In detail, a current sampling function of the current sampling unit 111 may be implemented by a galvanometer.

There are many implementations for the second adjusting unit in FIG. 11 to adjust the second reference voltage, which is described in detail in the following with reference to FIGS. 12-14.

Figure 12:
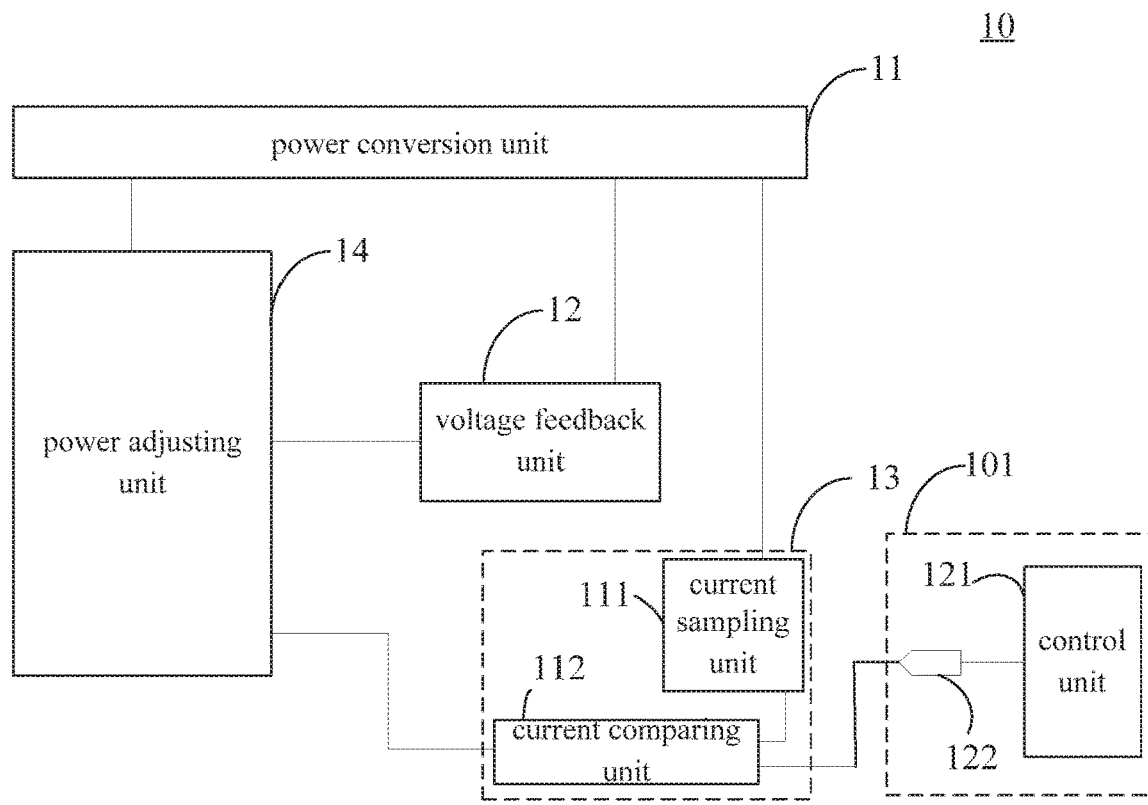
FIG. 12 is a schematic diagram of a second adapter according to yet another embodiment of the present disclosure.

In some embodiments, as illustrated in FIG. 12, the second adjusting unit 101 may include a control unit 121 and a second DAC 122. An input end of the second DAC 122 is coupled to the control unit 121, and an output end of the second DAC is coupled to the current comparing unit 112. The control unit 121 adjusts the value of the second reference voltage via the second DAC 122.

In detail, the control unit 121 may be a MCU. The MCU may be coupled to the second DAC 122 via a DAC port. The MCU outputs a digital signal via the DAC port, and the digital signal is converted to an analog signal by the second DAC 122. The analog signal is the value of the second reference voltage. The DAC has characteristics of high conversion speed and high accuracy, and thus a speed and an accuracy of the second adapter for adjusting and controlling the reference voltage are improved by adjusting the reference voltage with the DAC.

Figure 13:
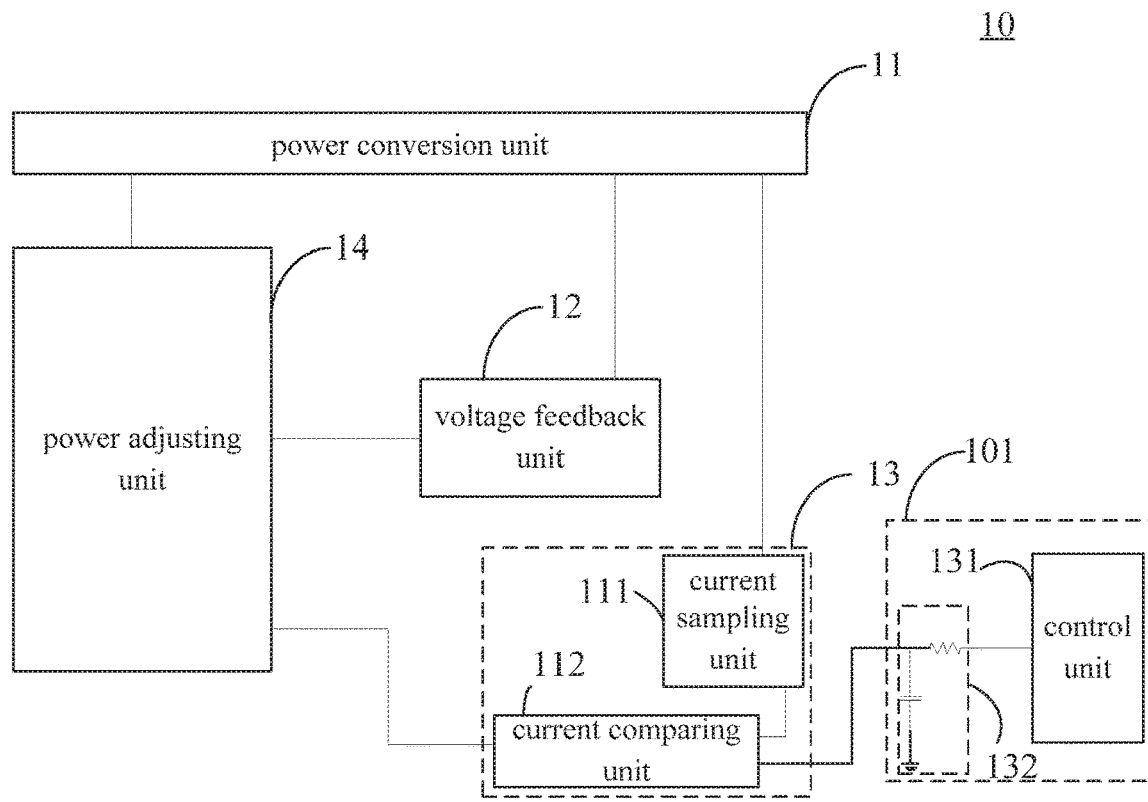
FIG. 13 is a schematic diagram of a second adapter according to yet another embodiment of the present disclosure.

In some embodiments, as illustrated in FIG. 13, the second adjusting unit 101 may include a control unit 131 and an RC filter unit 132. An input end of the RC filter unit 132 is coupled to the control unit 131, and an output end of the RC filter unit 132 is coupled to the current comparing unit 112. The control unit 131 is configured to generate a PWM signal, and to adjust the value of the second reference voltage by adjusting a duty ratio of the PWM signal.

In detail, the control unit 131 may be a MCU. The MCU may output the PWM signal via a PWM port. After the PWM signal is filtered by the RC filter unit 132, a stable analog quantity, i.e., the second reference voltage, is formed. The RC filter unit 132 has characteristics of being easy to implement and low price, and thus the second reference voltage can be adjusted with low cost.

Figure 14:
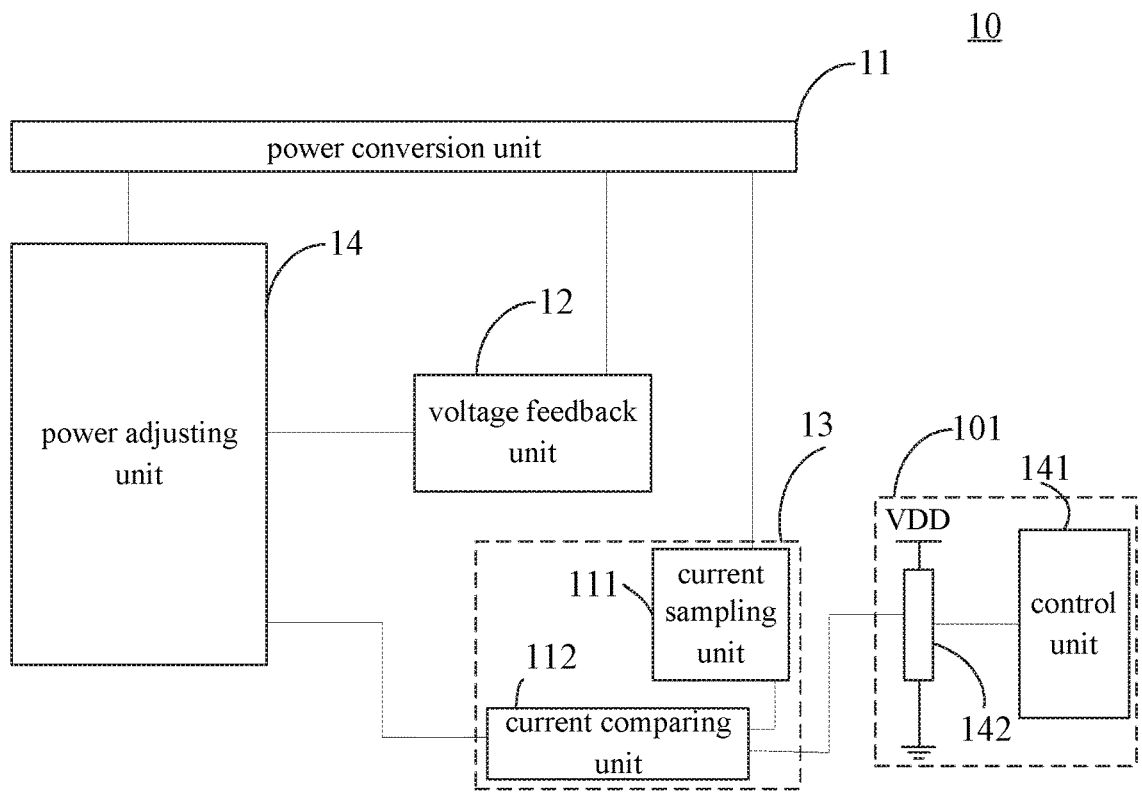
FIG. 14 is a schematic diagram of a second adapter according to yet another embodiment of the present disclosure.

In some embodiments, as illustrated in FIG. 14, the second adjusting unit 101 may include a control unit 141 and a digital potentiometer 142. A control end of the digital potentiometer 142 is coupled to the control unit 141, and an output end of the digital potentiometer 142 is coupled to the current comparing unit 112. The control unit 141 adjusts the value of the second reference voltage by adjusting a division ratio of the digital potentiometer 142.

In some embodiments, the control unit 141 may be a MCU. The MCU may be coupled to the control end of the digital potentiometer 142 via an I2C interface, and configured to adjust the division ratio of the digital potentiometer 142. A high potential end of the digital potentiometer 142 may be VDD, i.e., a power end. A low potential end of the digital potentiometer 142 may be coupled to ground. An output end (or called as an adjusting output end) of the digital potentiometer 142 is coupled to the current comparing unit 112, and configured to output the second reference voltage to the current comparing unit 112. It is easy to implement the digital potentiometer 142 and the cost is low, thus realizing adjusting the second reference voltage with a low cost.

Figure 15:
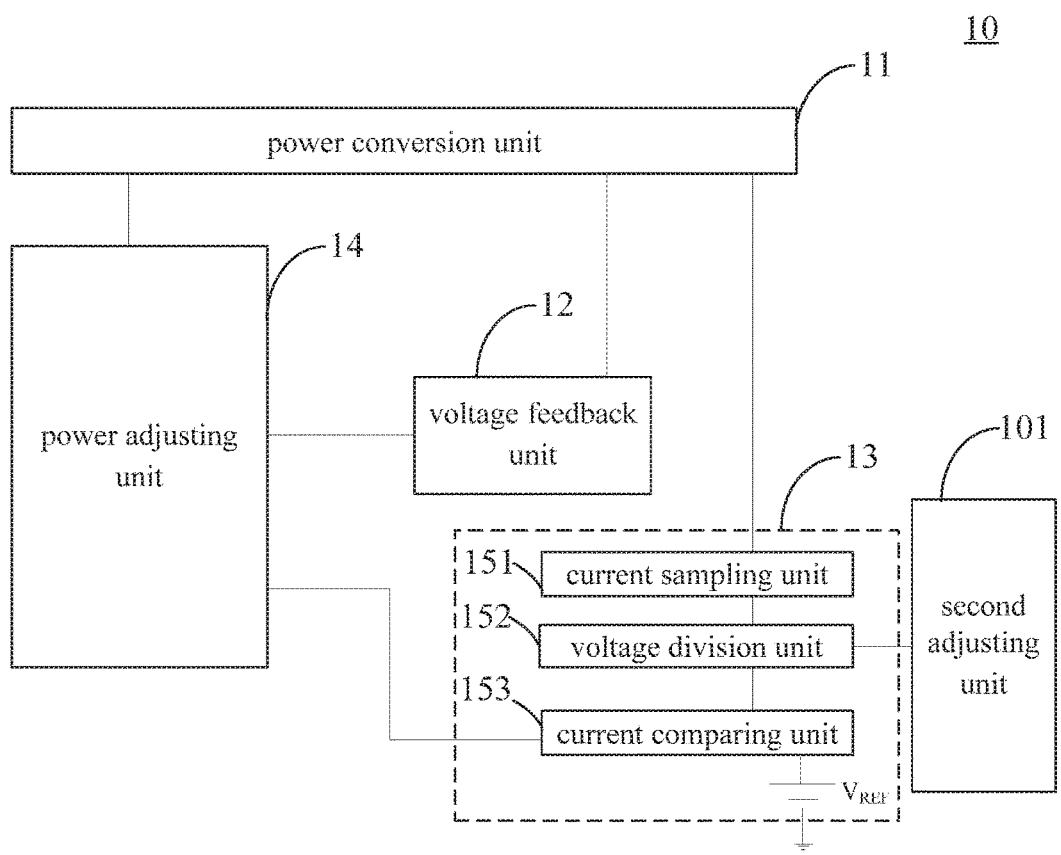
FIG. 15 is a schematic diagram of a second adapter according to yet another embodiment of the present disclosure.

In some embodiments, based on the embodiment in FIG. 10, as illustrated in FIG. 15, the current feedback unit 13 may include a current sampling unit 151, a voltage division unit 152, and a current comparing unit 153. An input end of the current sampling unit 151 is coupled to the power conversion unit 11. The current sampling unit 151 is configured to sample the output current of the second adapter 10 to obtain a third voltage. The third voltage is configured to indicate a size of the output current of the second adapter 10. An input end of the voltage division unit 152 is coupled to an output end of the current sampling unit 151. The voltage division unit 152 is configured to perform voltage division on the third voltage according to a predetermined division ratio, to generate the second voltage. An input end of the current comparing unit 153 is coupled to an output end of the voltage division unit 152. The current sampling unit 153 is configured to compare the second voltage with the second reference voltage, and to generate the current feedback signal based on a result of comparing the second voltage with the second reference voltage. The second adjusting unit 101 is coupled to the voltage division unit 152, and adjusts the value of the target current by adjusting the division ratio of the voltage division unit 152.

A main difference between the embodiment illustrated in FIG. 15 and the embodiments illustrated in FIGS. 11-14 is as follows. Adjusting the value of the target current is realized by adjusting the reference voltage of the current comparing unit in the embodiments illustrated in FIGS. 11-14, while adjusting the value of the target current is realized by adjusting the division ratio of the voltage division unit 152 in the embodiment illustrated in FIG. 15. In other words, in the embodiment illustrated in FIG. 15, the second reference voltage may be set as a fixed value $V_{REF}$. If the output current of the second adapter is expected to be 300 mA, the division ratio of the voltage division unit 152 may be adjusted, so that a voltage at the output end of the voltage division unit 152 is equal to $V_{REF}$ when the output current of the second adapter is 300 mA. Similarly, if the output current of the second adapter is expected to be 500 mA, the division ratio of the voltage division unit 152 may be adjusted, so that the voltage at the output end of the voltage division unit 152 is equal to $V_{REF}$ when the output current of the second adapter is 500 mA.

There are many implementations of the voltage division unit 152 according to embodiments of the present disclosure. For example, the voltage division unit may be realized by a digital potentiometer, or above functions of voltage division and adjusting the division ratio may be realized through discrete elements such as resistors and switches.

Figure 16:
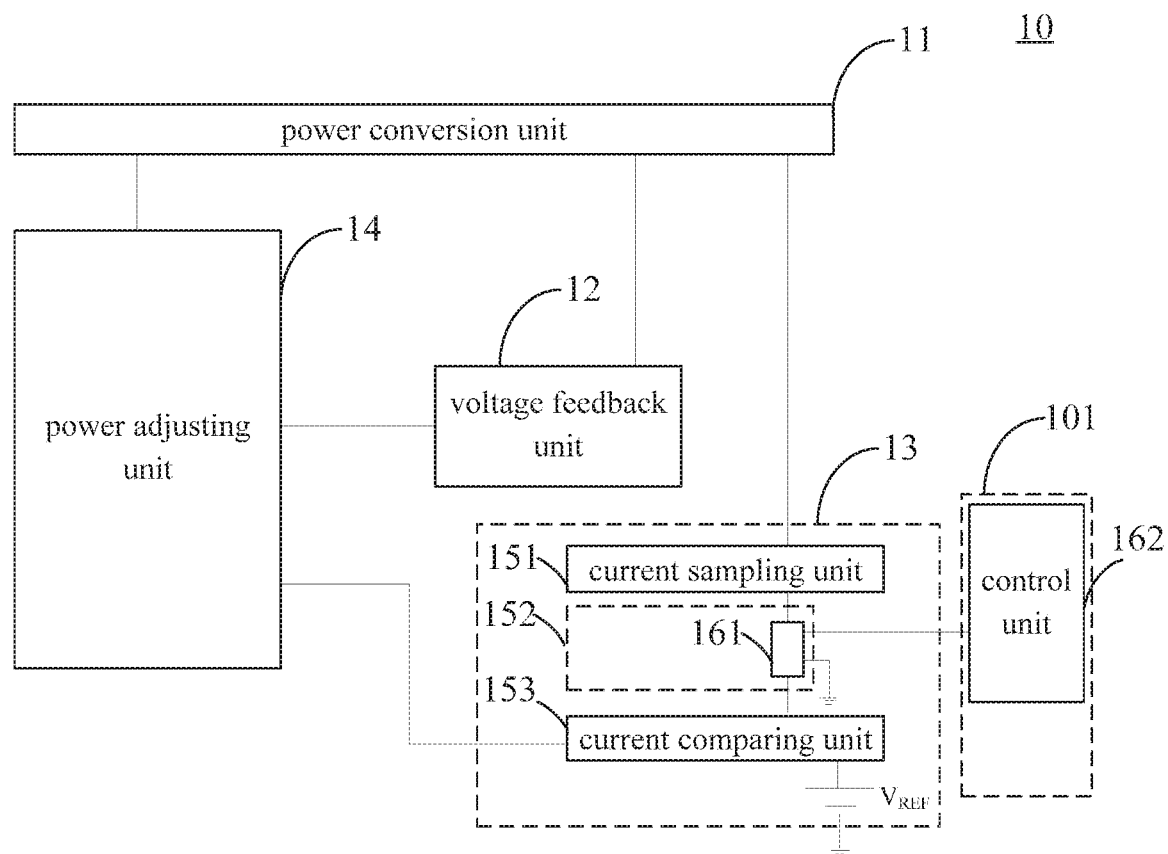
FIG. 16 is a schematic diagram of a second adapter according to yet another embodiment of the present disclosure.

Taking the digital potentiometer as an example, as illustrated in FIG. 16, the voltage division unit 152 includes a digital potentiometer 161, and the second adjusting unit 101 includes a control unit 162. A high potential end of the digital potentiometer 161 is coupled to the output end of the current sampling unit 151, and a low potential end of the digital potentiometer 161 is coupled to the ground. An output end of the digital potentiometer 161 is coupled to the input end of the current comparing unit 153. The control unit 162 is coupled to a control end of the digital potentiometer 161, and configured to adjust the division ratio of the digital potentiometer 161.

The control unit above may be one control unit, or may include a plurality of control units. In some embodiments, the control units in the first adjusting unit and the second adjusting unit are a same control unit.

Figure 17:
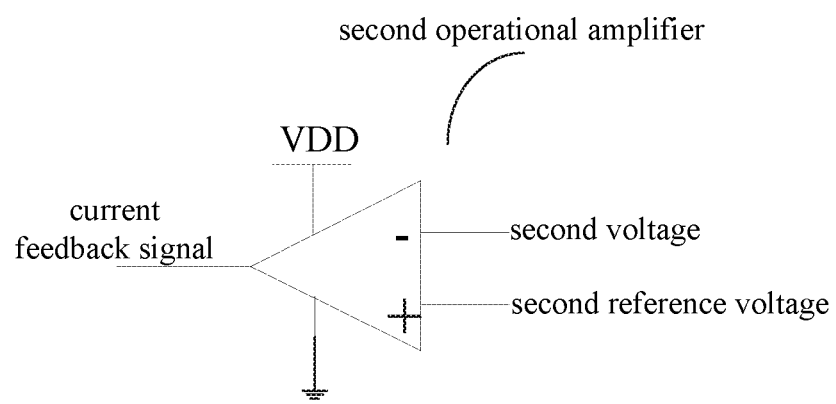
FIG. 17 is a schematic diagram of a current comparing unit according to an embodiment of the present disclosure.

There are many implementations of the current comparing unit 153. In some embodiments, as illustrated in FIG. 17, the current comparing unit 153 may include a second operational amplifier. An inverting input end of the second operational amplifier is configured to receive the second voltage, an in-phase input end of the second operational amplifier is configured to receive the second reference voltage, and an output end of the second operational amplifier is configured to generate the current feedback signal. The second operational amplifier may also be called as a second error amplifier, or a current error amplifier.

Implementations of the voltage feedback unit 12 and the current feedback unit 13 and ways for adjusting the target voltage corresponding to the voltage feedback unit 12 and target current corresponding to the current feedback unit 13 are described in detail above with reference to FIGS. 1-17. Implementations of the power adjusting unit 14 will be described in detail in the following with reference to FIG. 18.

Figure 18:
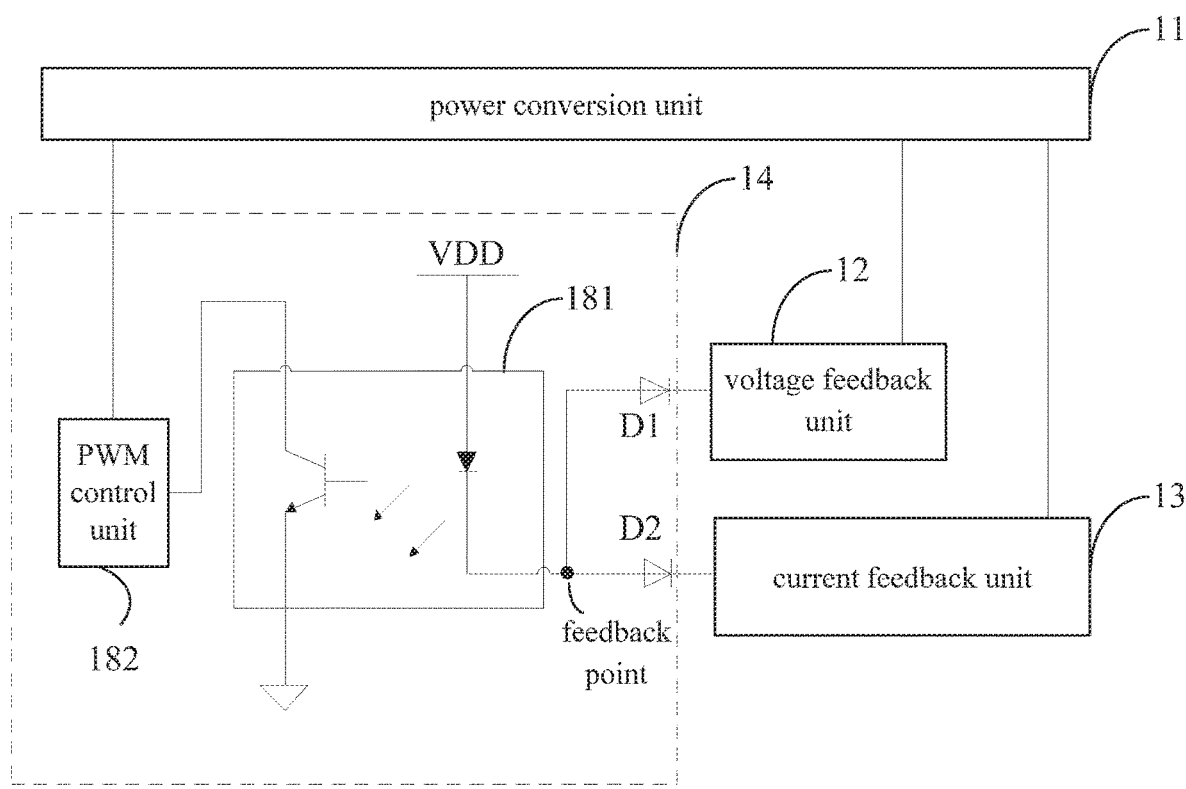
FIG. 18 is a schematic diagram of a second adapter according to yet another embodiment of the present disclosure.

In some embodiments, as illustrated in FIG. 18, the voltage feedback unit 12 may include a first operational amplifier (not illustrated in FIG. 18, and for details, see FIG. 9), and the output end of the first operational amplifier of the voltage feedback unit 12 is configured to output the voltage feedback signal. The current feedback unit 13 may include a second operational amplifier (not illustrated in FIG. 18, and for details, see FIG. 17), and the output end of the second operational amplifier of the current feedback unit 13 is configured to output the current feedback signal. The power adjusting unit 14 may include a first diode D1, a second diode D2, an optical coupling unit 181, and a PWM control unit 182. The output end of the first operational amplifier of the voltage feedback unit 12 (referring to FIG. 9, the output end of the first operational amplifier is configured to output the voltage feedback signal) is coupled to a cathode of the first diode D1. An anode of the first diode D1 is coupled to an input end of the optical coupling unit 181. The output end of the second operational amplifier of the current feedback unit 13 (referring to FIG. 17, the output end of the second operational amplifier is configured to output the current feedback signal) is coupled to a cathode of the second diode D2. An anode of the second diode D2 is coupled to the input end of the optical coupling unit 181. An output end of the optical coupling unit 181 is coupled to an input end of the PWM control unit 182. An output end of the PWM control unit 182 is coupled to the power conversion unit 11.

It should be understood that, the first operational amplifiers herein may be a same operational amplifier. Similarly, the second operational amplifiers herein may be a same operational amplifier.

In detail, in this embodiment, a voltage signal output by the first operational amplifier is the voltage feedback signal, and a voltage signal output by the second operational amplifier is the current feedback signal. The voltage signal output by the first operational amplifier being 0 indicates that the output voltage of the second adapter reaches the target voltage, and the voltage signal output by the second operational amplifier being 0 indicates that the output current of the second adapter reaches the target current. The first diode D1 and the second diode D2 are two diodes in reverse parallel. When any one of the voltage signals output by the first operational amplifier and the second operational amplifier is 0, a voltage at a feedback point in FIG. 18 is 0 (since a voltage difference is required for an diode to conduct, an actual voltage at the feedback point may be slightly larger than 0, such as 0.7V). In this case, the optical coupling unit 181 operates in a stable status, and outputs a stable voltage signal to the PWM control unit 182. And then, the PWM control unit 182 generates a PWM control signal with a certain duty ratio, and stabilizes the output voltage and the output current of the second adapter via the power conversion unit 11. In other words, when any one of the output voltage and the output current of the second adapter reaches a target value, the first diode D1 and the second diode D2 in reverse parallel may sense occurrence of this event immediately, and then the output voltage and the output current of the second adapter are stabilized.

In some embodiments, the second adapter 10 may support a first charging mode and a second charging mode. A charging speed of the second adapter 10 charging the device to be charged (such as the terminal) in the second charging mode is greater than a charging speed of the second adapter 10 charging the device to be charged (such as the terminal) in the first charging mode. In other words, compared to the second adapter 10 working in the first charging mode, the second adapter 10 working in the second charging mode can fully charge the battery having the same capacity in the device to be charged (such as the terminal) in a shorter time period.

The second adapter 10 includes a control unit. During the second adapter 10 is coupled to the device to be charged (such as the terminal), the control unit performs bidirectional communication with the device to be charged (such as the terminal) to control the charging process in the second charging mode. The control unit may be any of the control units described in embodiments. For example, the control unit may be a control unit in the first adjusting unit, or may be a control unit in the second adjusting unit.

The first charging mode may be a normal charging mode and the second charging mode may be a fast charging mode. Under the normal charging mode, the second adapter outputs a relatively small current (typically less than 2.5 A) or charges the battery in the device to be charged (such as the terminal) with a relatively small power (typically less than 15 W). In the normal charging mode, it may take several hours to fully charge a larger capacity battery (such as a battery with 3000 mAh). In contrast, under the fast charging mode, the second adapter outputs a relatively large current (typically greater than 2.5 A, such as 4.5 A, 5 A or higher) or charges the battery in the device to be charged (such as the terminal) with a relatively large power (typically greater than or equal to 15 W). Compared to the normal charging mode, the charging speed of the second adapter in the fast charging mode is faster, and the charging time required for fully charging a battery with a same capacity in the fast charging mode may be significantly shortened.

The communicated content between the control unit of the second adapter and the device to be charged (such as the terminal) is not limited in embodiments of the present disclosure, and the control method of the control unit on the output of the second adapter in the second charging mode is also not limited in embodiments of the present disclosure. For example, the control unit may communicate with the device to be charged (such as the terminal) to obtain the present voltage or present electric quantity of the battery in the device to be charged (such as the terminal), and adjust the output voltage or output current of the second adapter based on the present voltage or present electric quantity of the battery. In the following, the communicated content between the control unit and the device to be charged (such as the terminal) and the control method of the control unit on the output of the second adapter in the second charging mode will be described in detail in combination with specific embodiments.

In some embodiments, the control unit performs the bidirectional communication with the device to be charged (such as the terminal) to control the output of the second adapter in the second charging mode as follows. The control unit performs the bidirectional communication with the device to be charged (such as the terminal) to negotiate the charging mode between the second adapter and the device to be charged (such as the terminal).

In embodiments of the present disclosure, the second adapter does not perform a fast charging on the device to be charged (such as the terminal) in the second charging mode blindly, but performs the bidirectional communication with the device to be charged (such as the terminal) to negotiate whether the second adapter can perform the fast charging on the device to be charged (such as the terminal) in the second charging mode. In this way, safety of charging process can be improved.

In detail, the control unit performs the bidirectional communication with the device to be charged (such as the terminal) to negotiate the charging mode between the second adapter and the device to be charged (such as the terminal) as follows. The control unit sends a first instruction to the device to be charged (such as the terminal), in which the first instruction is configured to query the device to be charged (such as the terminal) whether to operate in the second charging mode. The control unit receives a reply instruction of to the first instruction sent by the device to be charged (such as the terminal), in which the reply instruction of the first instruction is configured to indicate whether the device to be charged (such as the terminal) is able to operate in the second charging mode. When the device to be charged (such as the terminal) is able to operate in the second charging mode, the control unit charges the device to be charged (such as the terminal) in the second charging mode.

The master-slave relation of the second adapter (or the control unit in the second adapter) and the device to be charged (such as the terminal) is not limited in embodiments of the present disclosure. In other words, any of the control unit and the device to be charged (such as the terminal) can be configured as the master device for initiating the bidirectional communication session, accordingly, the other one can be configured as the slave device for making a first response or a first reply to the communication initiated by the master device. As a feasible implementation, during the communication, the identifications of the master device and the slave device can be determined by comparing the electrical levels of the second adapter and the device to be charged (such as the terminal) relative to the ground.

The specific implementation of bidirectional communication between the second adapter (or the control unit in the second adapter) and the device to be charged (such as the terminal) is not limited in embodiments of the present disclosure. In other words, any of the second adapter (or the control unit in the second adapter) and the device to be charged (such as the terminal) can be configured as the master device for initiating the bidirectional communication session, accordingly, the other one can be configured as the slave device making a first response or a first reply to the communication initiated by the master device, and the master device is able to make a second response to the first response or the first reply of the slave device, and thus a negotiation about a charging mode can be realized between the master device and the slave device. As a feasible implementation, a charging operation between the master device and the slave device is performed after a plurality of negotiations about the charging mode are completed between the master device and the slave device, such that the charging process can be performed safely and reliably after the negotiation.

As an implementation, the master device is able to make a second response to the first response or the first reply made by the slave device to the communication session in a manner that, the master device is able to receive the first response or the first reply made by the slave device to the communication session and to make a targeted second response to the first response or the first reply. As an example, when the master device receives the first response or the first reply made by the slave device to the communication session in a predetermined time period, the master device makes the targeted second response to the first response or the first reply of the slave device in a manner that, the master device and the slave device complete one negotiation about the charging mode, and a charging process may be performed between the master device and the salve device in the first charging mode or the second charging mode, i.e., the second adapter charges the device to be charged (such as the terminal) in the first charging mode or the second charging mode according to a negotiation result.

As another implementation, the master device is able to make a second response to the first response or the first reply made by the slave device to the communication session in a manner that, when the master device does not receive the first response or the first reply made by the slave device to the communication session in the predetermined time period, the master device also makes the targeted second response to the first response or the first reply of the slave device. As an example, when the master device does not receive the first response or the first reply made by the slave device to the communication session in the predetermined time period, the master device makes the targeted second response to the first response or the first reply of the slave device in a manner that, the master device and the slave device complete one negotiation about the charging mode, the charging process is performed between the master device and the slave device in the first charging mode, i.e., the second adapter charges the device to be charged (such as the terminal) in the first charging mode.

In some embodiments, when the device to be charged (such as the terminal) is configured as the master device for initiating the communication session, after the second adapter (or the control unit in the second adapter) configured as the slave device makes the first response or the first reply to the communication session initiated by the master device, it is unnecessary for the device to be charged (such as the terminal) to make the targeted second response to the first response or the first reply of the second adapter, i.e., one negotiation about the charging mode is regarded as completed between the second adapter (or the control unit in the second adapter) and the device to be charged (such as the terminal), and the second adapter is able to charge the device to be charged (such as the terminal) in the first charging mode or the second charging mode according to the negotiation result.

In some embodiments, the control unit performs the bidirectional communication with the device to be charged (such as the terminal) to control the output of the second adapter in the second charging mode as follows. The control unit performs the bidirectional communication with the device to be charged (such as the terminal) to determine a charging voltage output by the second adapter in the second charging mode for charging the device to be charged (such as the terminal). The control unit adjusts the value of the target voltage, such that the value of the target voltage is equal to the charging voltage output by the second adapter in the second charging mode for charging the device to be charged (such as the terminal).

In detail, the control unit performs the bidirectional communication with the device to be charged (such as the terminal) to determine the charging voltage output by the second adapter in the second charging mode for charging the device to be charged (such as the terminal) as follows. The control unit sends a second instruction to the device to be charged (such as the terminal), in which the second instruction is configured to query whether the output voltage of the second adapter matches with the present voltage of the battery in the device to be charged (such as the terminal). The control unit receives a reply instruction of the second instruction sent by the device to be charged (such as the terminal), in which the reply instruction of the second instruction is configured to indicate that the output voltage of the second adapter matches with the present voltage of the battery, or is higher or lower than the present voltage of the battery. In another embodiment, the second instruction can be configured to query whether the present output voltage of the second adapter is suitable for being used as the charging voltage output by the second adapter in the second charging mode for charging the device to be charged (such as the terminal), and the reply instruction of the second instruction can be configured to indicate the present output voltage of the second adapter is suitable, high or low. When the present output voltage of the second adapter matches with the present voltage of the battery or the present output voltage of the second adapter is suitable for being used as the charging voltage output by the second adapter in the second charging mode for charging the device to be charged (such as the terminal), it indicates that the present output voltage of the second adapter may be slightly higher than the present voltage of the battery, and a difference between the output voltage of the second adapter and the present voltage of the battery is within a predetermined range (typically in an order of hundreds of millivolts).

In some embodiments, the control unit may perform the bidirectional communication with the device to be charged (such as the terminal) to control the output of the second adapter in the second charging mode as follows. The control unit performs the bidirectional communication with the device to be charged (such as the terminal) to determine the charging current output by the second adapter in the second charging mode for charging the device to be charged (such as the terminal). The control unit adjusts the value of the target current, such that the value of the target current is equal to the charging current output by the second adapter in the second charging mode for charging the device to be charged (such as the terminal).

In detail, the control unit performs the bidirectional communication with the device to be charged (such as the terminal) to determine the charging current output by the second adapter in the second charging mode for charging the device to be charged (such as the terminal) as follows. The control unit sends a third instruction to the device to be charged (such as the terminal), in which the third instruction is configured to query a maximum charging current presently supported by the device to be charged (such as the terminal). The control unit receives a reply instruction of the third instruction sent by the device to be charged (such as the terminal), in which the reply instruction of the third instruction is configured to indicate the maximum charging current presently supported by the device to be charged (such as the terminal). The control unit determines the charging current output by the second adapter in the second charging mode for charging the device to be charged (such as the terminal) according to the maximum charging current presently supported by the device to be charged (such as the terminal). It should be understood that, the control unit can determine the charging current output by the second adapter in the second charging mode for charging the device to be charged (such as the terminal) according to the maximum charging current presently supported by the device to be charged in many ways. For example, the second adapter can determine the maximum charging current presently supported by the device to be charged (such as the terminal) as the charging current output by the second adapter in the second charging mode for charging the device to be charged, or can determine the charging current output by the second adapter in the second charging mode for charging the device to be charged (such as the terminal) after comprehensively considering the maximum charging current presently supported by the device to be charged (such as the terminal) and its own current output capability.

In some embodiments, the control unit may perform the bidirectional communication with the device to be charged (such as the terminal) to control the output of the second adapter in the second charging mode as follows. During a charging process that the second adapter charges the device to be charged (such as the terminal) in the second charging mode, the control unit performs the bidirectional communication with the device to be charged (such as the terminal) to adjust the output current of the second adapter in the second charging mode.

In detail, the control unit may perform the bidirectional communication with the device to be charged (such as the terminal) to adjust the output current of the second adapter as follows. The control unit sends a fourth instruction to the device to be charged (such as the terminal), in which the fourth instruction is configured to query a present voltage of the battery in the device to be charged (such as the terminal). The control unit receives a reply instruction of the fourth instruction sent by the device to be charged (such as the terminal), in which the reply instruction of the fourth instruction is configured to indicate the present voltage of the battery. The control unit adjusts the output current of the second adapter according to the present voltage of the battery.

In some embodiments, as illustrated in FIG. 19A, the second adapter 10 includes a charging interface 191. Further, in some embodiments, the control unit (such as the MCU in FIG. 23) in the second adapter 10 can perform the bidirectional communication with the device to be charged (such as the terminal) via a data wire 192 of the charging interface 191.

In some embodiments, the control unit may perform the bidirectional communication with the device to be charged (such as the terminal) to control the output of the second adapter in the second charging mode as follows. The control unit performs the bidirectional communication with the device to be charged (such as the terminal) to determine whether the charging interface is in poor contact.

In detail, the control unit performs the bidirectional communication with the device to be charged (such as the terminal) to determine whether the charging interface is in poor contact as follows. The control unit sends the fourth instruction to the device to be charged (such as the terminal), in which the fourth instruction is configured to query the present voltage of the battery in the device to be charged (such as the terminal). The control unit receives the reply instruction of the fourth instruction sent by the device to be charged (such as the terminal), in which the reply instruction of the fourth instruction is configured to indicate the present voltage of the battery. The control unit determines whether the charging interface is in poor contact according to the output voltage of the second adapter and the present voltage of the battery in the device to be charged (such as the terminal). For example, when the control unit determines a difference between the output voltage of the second adapter and the present voltage of the battery in the device to be charged (such as the terminal) is greater than a predetermined voltage threshold, it indicates that an impedance obtained by dividing the voltage difference by the present current value output by the second adapter is greater than a preset impedance threshold, and thus it can be determined that the charging interface is in poor contact.

In some embodiments, it can be determined by the device to be charged (such as the terminal) whether the charging interface is in poor contact. The device to be charged (such as the terminal) sends a sixth instruction to the control unit, in which the sixth instruction is configured to query the output voltage of the second adapter. The device to be charged (such as the terminal) receives a reply instruction of the sixth instruction, in which the reply instruction of the sixth instruction is configured to indicate the output voltage of the second adapter. The device to be charged (such as the terminal) determines whether the charging interface is in poor contact according to the output voltage of the second adapter and the present voltage of the battery in the device to be charged (such as the terminal). After the device to be charged (such as the terminal) determines that the charging interface is in poor contact, the device to be charged (such as the terminal) sends a fifth instruction to the control unit, in which the fifth instruction is configured to indicate that the charging interface is in poor contact. After receiving the fifth instruction, the control unit can control the second adapter to quit the second charging mode.

Figure 19B:
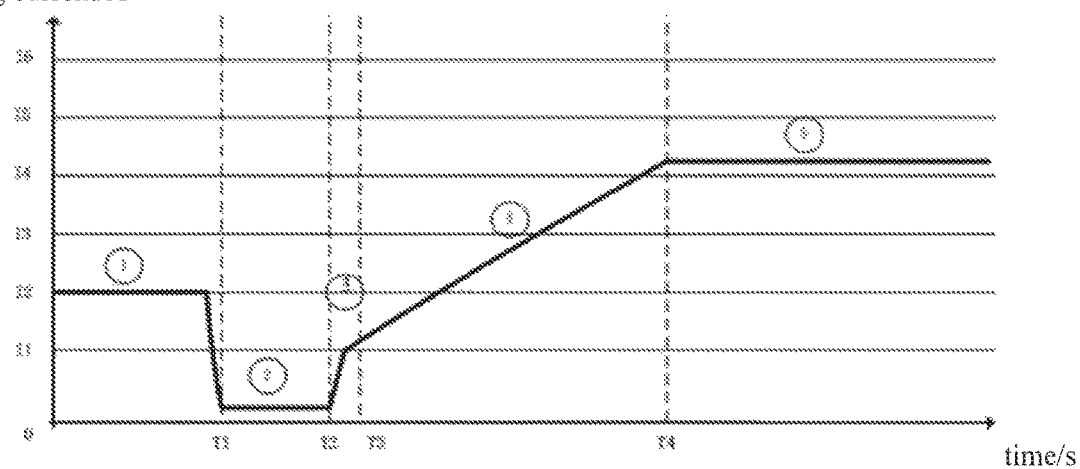
FIG. 19B is a schematic diagram illustrating a fast charging communication process according to an embodiment of the present disclosure.

With reference to FIG. 19B, the communication procedure between the control unit in the second adapter and the device to be charged (such as the terminal) will be described in detail. It should be noted that, examples in FIG. 19B are merely used to help those skilled in the related art to understand embodiments of the present disclosure. The embodiments shall not be limited to the specific numeric values or specific scenes. Apparently, various modifications and equivalents can be made by those skilled in the related art based on examples in FIG. 19B, and those modifications and equivalents shall fall within the protection scope of the present disclosure.

As illustrated in FIG. 19B, the charging process that the second adapter charges the device to be charged (such as the terminal) in the second charging mode may include the following five stages.

Stage 1:

After the device to be charged (such as the terminal) is coupled to a power supply providing device, the device to be charged (such as the terminal) may detect a type of the power supply providing device via the data wires D+ and D−. When detecting that the power supply providing device is the second adapter, the device to be charged (such as the terminal) may absorb current greater than a predetermined current threshold I2, such as 1 A. When the control unit in the second adapter detects that the current output by the second adapter is greater than or equal to I2 within a predetermined time period (such as a continuous time period T1), the control unit determines that the device to be charged (such as the terminal) has completed the recognition of the type of the power supply providing device. The control unit initiates a negotiation between the second adapter and the device to be charged (such as the terminal), and sends an instruction 1 (corresponding to the above-mentioned first instruction) to the device to be charged (such as the terminal) to query whether the device to be charged (such as the terminal) agrees that the second adapter charges the device to be charged (such as the terminal) in the second charging mode.

When the control unit receives a reply instruction of the instruction 1 from the device to be charged (such as the terminal) and the reply instruction of the instruction 1 indicates that the device to be charged (such as the terminal) disagrees that the second adapter charges the device to be charged (such as the terminal) in the second charging mode, the control unit detects the output current of the second adapter again. When the output current of the second adapter is still greater than or equal to I2 within a predetermined continuous time period (such as a continuous time period T1), the control unit sends the instruction 1 again to the device to be charged (such as the terminal) to query whether device to be charged (such as the terminal) agrees that the second adapter charges the device to be charged (such as the terminal) in the second charging mode. The control unit repeats the above actions in stage 1, until the device to be charged (such as the terminal) agrees that the second adapter charges the device to be charged (such as the terminal) in the second charging mode or the output current of the second adapter is no longer greater than or equal to I2.

After the device to be charged (such as the terminal) agrees the second adapter to charge the device to be charged (such as the terminal) in the second charging mode, the communication procedure goes into stage 2.

Stage 2:

For the output voltage of the second adapter, there may be several levels. The control unit sends an instruction 2 (corresponding to the above-mentioned second instruction) to the device to be charged (such as the terminal) to query whether the output voltage of the second adapter (the present output voltage) matches with the present voltage of the battery in the device to be charged (such as the terminal).

The device to be charged (such as the terminal) sends a reply instruction of the instruction 2 to the control unit, for indicating that the output voltage of the second adapter matches with the present voltage of the battery in the device to be charged (such as the terminal), or is higher or lower than the present voltage of the battery in the device to be charged (such as the terminal). When the reply instruction of the instruction 2 indicates that the output voltage of the second adapter is higher, or lower, the control unit adjusts the output voltage of the second adapter by one level, and sends the instruction 2 to the device to be charged (such as the terminal) again to query whether the output voltage of the second adapter matches with the present voltage of the battery (such as the terminal). The above actions in stage 2 are repeated, until the device to be charged (such as the terminal) determines that the output voltage of the second adapter matches with the present voltage of the battery (such as the terminal). Then, the communication procedure goes into stage 3.

Stage 3:

The control unit sends an instruction 3 (corresponding to the above-mentioned third instruction) to the device to be charged (such as the terminal) to query the maximum charging current presently supported by the device to be charged (such as the terminal). The device to be charged (such as the terminal) sends a reply instruction of the instruction 3 to the control unit for indicating the maximum charging current presently supported by the device to be charged (such as the terminal), and then the communication procedure goes into stage 4.

Stage 4:

The control unit determines the charging current output by the second adapter in the second charging mode for charging the device to be charged (such as the terminal) according to the maximum charging current presently supported by the device to be charged (such as the terminal). Then, the communication procedure goes into stage 5, i.e., the constant current charging stage.

Stage 5:

When the communication procedure goes into the constant current charging stage, the control unit sends an instruction 4 (corresponding to the above-mentioned fourth instruction) to the device to be charged (such as the terminal) at intervals to query the present voltage of the battery in the device to be charged (such as the terminal). The device to be charged (such as the terminal) may send a reply instruction of the instruction 4 to the control unit, to feedback the present voltage of the battery in the device to be charged (such as the terminal). The control unit may determine according to the present voltage of the battery in the device to be charged (such as the terminal) whether the charging interface is in poor contact and whether it is necessary to decrease the output current of the second adapter. When the second adapter determines that the charging interface is in poor contact, the second adapter sends an instruction 5 (corresponding to the above-mentioned fifth instruction) to the device to be charged (such as the terminal), and the second adapter quits the second charging mode and then the communication procedure is reset and goes into stage 1 again.

In some embodiments of the present disclosure, in stage 1, when the device to be charged (such as the terminal) sends the reply instruction of the instruction 1, the reply instruction of the instruction 1 may carry data (or information) of the path impedance of the device to be charged (such as the terminal). The data of the path impedance of the device to be charged (such as the terminal) may be used in stage 5 to determine whether the charging interface is in poor contact.

In some embodiments of the present disclosure, in stage 2, the time period from when the device to be charged (such as the terminal) agrees the second adapter to charge the device to be charged (such as the terminal) in the second charging mode to when the control unit adjusts the output voltage of the second adapter to a suitable value may be controlled in a certain range. If the time period exceeds a predetermined range, the second adapter or the device to be charged (such as the terminal) may determine that the fast charging communication procedure is abnormal, and is reset and goes into stage 1.

In some embodiments, in stage 2, when the output voltage of the second adapter is higher than the present voltage of the battery in the device to be charged (such as the terminal) by $\Delta V$ ($\Delta V$ may be set to 200-500 mV), the device to be charged (such as the terminal) may send a reply instruction of the instruction 2 to the control unit, for indicating that the output voltage of the second adapter matches with the voltage of the battery in the device to be charged (such as the terminal).

In some embodiments of the present disclosure, in stage 4, the adjusting speed of the output current of the second adapter may be controlled to be in a certain range, thus avoiding an abnormity occurring in the charging process that the second adapter charges the device to be charged (such as the terminal) in the second charging mode due to the too fast adjusting speed.

In some embodiments of the present disclosure, in stage 5, the variation degree of the output current of the second adapter may be controlled to be less than or equal to 5%.

In some embodiments of the present disclosure, in stage 5, the control unit can monitor the path impedance of a charging loop in real time. In detail, the control unit can monitor the path impedance of the charging loop according to the output voltage of the second adapter, the output current of the second adapter and the present voltage of the battery fed back by the device to be charged (such as the terminal). When the path impedance of the charging loop is greater than a sum of the path impedance of the device to be charged (such as the terminal) and the impedance of the charging wire, it may be considered that the charging interface is in poor contact, and thus the second adapter stops charging the device to be charged (such as the terminal) in the second charging mode.

In some embodiments of the present disclosure, after the second adapter starts to charge the device to be charged (such as the terminal) in the second charging mode, time intervals of communications between the control unit and the device to be charged (such as the terminal) may be controlled to be in a certain range, thus avoiding abnormity in the communication procedure due to the too short time interval of communications.

In some embodiments of the present disclosure, the stop of the charging process (or the stop of the charging process that the second adapter charges the device to be charged (such as the terminal) in the second charging mode) may be a recoverable stop or an unrecoverable stop.

For example, when it is detected that the battery in the device to be charged (such as the terminal) is fully charged or the charging interface is poor contact, the charging process is stopped and the charging communication procedure is reset, and the charging process goes into stage 1 again. When the device to be charged (such as the terminal) disagrees that the second adapter charges the device to be charged (such as the terminal) in the second charging mode, the communication procedure would not go into stage 2. The stop of the charging process in such a case may be considered as an unrecoverable stop.

For another example, when an abnormity occurs in the communication between the control unit and the device to be charged (such as the terminal), the charging process is stopped and the charging communication procedure is reset, and the charging process goes into stage 1 again. After requirements for stage 1 are met, the device to be charged (such as the terminal) agrees that the second adapter charges the device to be charged (such as the terminal) in the second charging mode to recover the charging process. In this case, the stop of the charging process may be considered as a recoverable stop.

For another example, when the device to be charged (such as the terminal) detects that an abnormity occurs in the battery, the charging process is stopped and the charging communication process is reset, and the charging process goes into stage 1 again. The device to be charged (such as the terminal) disagrees that the second adapter charges the device to be charged (such as the terminal) in the second charging mode. When the battery returns to normal and the requirements for stage 1 are met, the device to be charged (such as the terminal) agrees that the second adapter charges the device to be charged (such as the terminal) in the second charging mode. In this case, the stop of fast charging process may be considered as a recoverable stop.

Communication actions or operations illustrated in FIG. 19B are merely exemplary. For example, in stage 1, after the device to be charged (such as the terminal) is coupled to the second adapter, the handshake communication between the device to be charged (such as the terminal) and the control unit may be initiated by the device to be charged (such as the terminal). In other words, the device to be charged (such as the terminal) sends an instruction 1 to query the control unit whether to operate in the second charging mode. When the device to be charged (such as the terminal) receives a reply instruction indicating that the second adapter is able to charge the device to be charged (such as the terminal) in the second charging mode from the control unit, the second adapter starts to charge the battery in the device to be charged (such as the terminal) in the second charging mode.

For another example, after stage 5, there may be a constant voltage charging stage. In detail, in stage 5, the device to be charged (such as the terminal) may feedback the present voltage of the battery to the control unit. The charging process goes into the constant voltage charging stage from the constant current charging stage when the present voltage of the battery reaches a voltage threshold for constant voltage charging. During the constant current charging stage, the charging current decreases gradually. When the current reduces to a certain threshold, the charging process is stopped, and it indicates that the battery in the device to be charged (such as the terminal) is fully charged.

Figure 20:
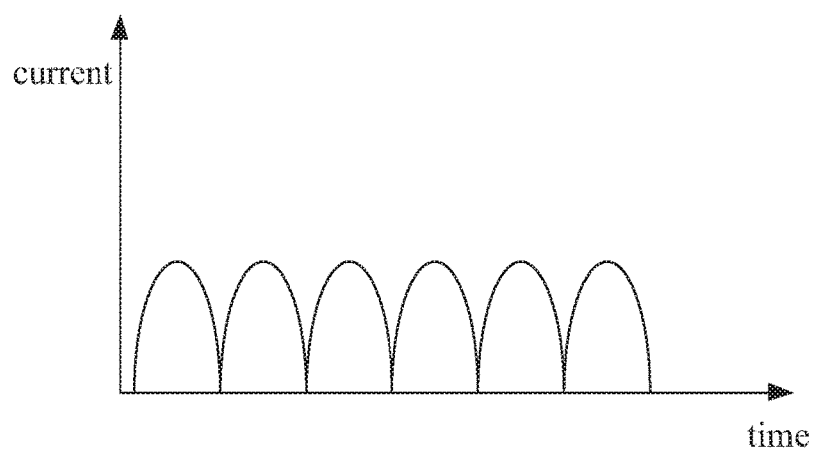
FIG. 20 is a schematic diagram illustrating a waveform of a pulsating direct current according to an embodiment of the present disclosure.

In some embodiments, the output current of the second adapter is pulsating direct current (or called as one-way pulsating output current, or called as current with a pulsating waveform, or called as current with a steamed bun waveform). A waveform of the pulsating direct current is illustrated in FIG. 20.

With the increasing of the output power of the second adapter, it is easy to cause lithium precipitation of the battery when the second adapter charges the battery in the device to be charged (such as the terminal), thus shortening service lifespan of the battery. In order to improve reliability and safety of the battery, in embodiments of the present disclosure, the second adapter is controlled to output the pulsating direct current. The pulsating direct current may reduce probability and intensity of arc discharge of a contact of a charging interface, and improve service lifespan of the charging interface. The output current of the second adapter may be set as the pulsating direct current in many ways. For example, the secondary filter unit in the power conversion unit 11 may be removed, and secondary current is directly output after rectification to form the pulsating direct current.

Figure 21:
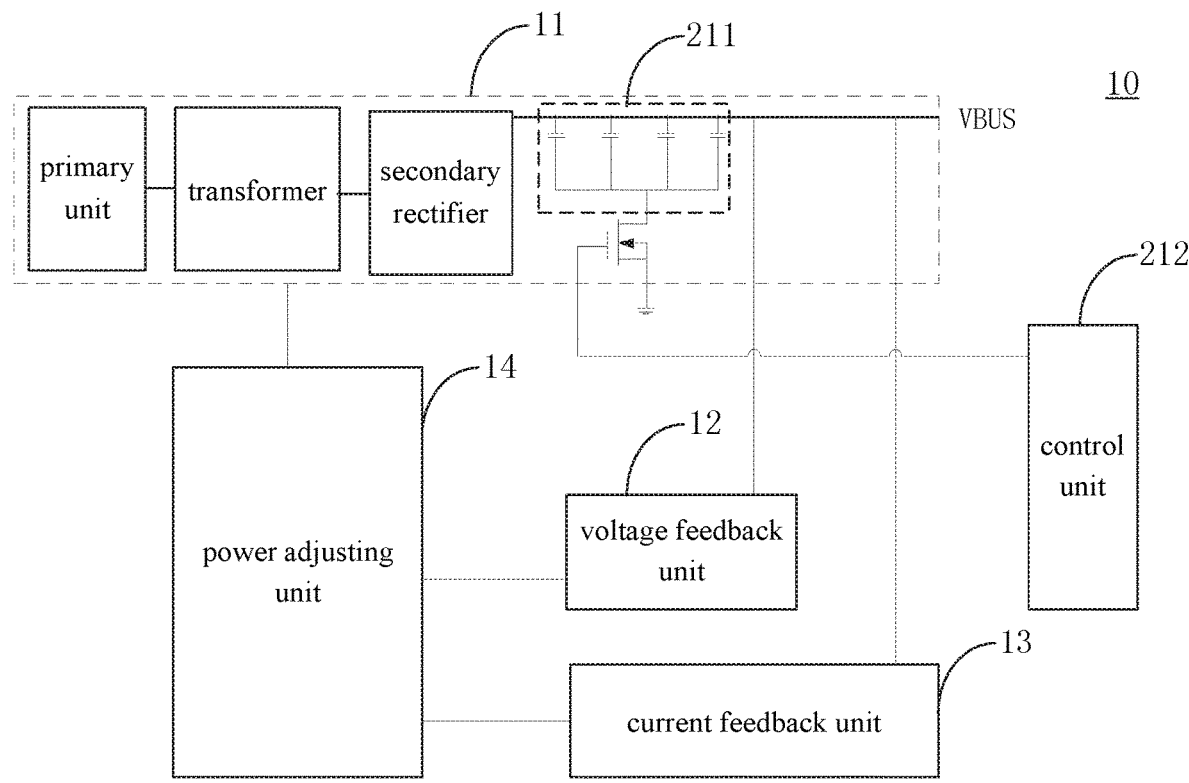
FIG. 21 is a schematic diagram of a second adapter according to yet another embodiment of the present disclosure.

Further, as illustrated in FIG. 21, based on any one of above embodiments, the second adapter 10 may support a first charging mode and a second charging mode. A charging speed of the second adapter charging the device to be charged (such as the terminal) in the second charging mode is greater than a charging speed of the second adapter charging the device to be charged (such as the terminal) in the first charging mode. The power conversion unit 11 may include a secondary filter unit 211. The second adapter 10 may include a control unit 212. The control unit 212 is coupled to the secondary filter unit 211. In the first charging mode, the control unit 212 controls the secondary filter unit 211 to work, such that the value of the output voltage of the second adapter 10 is constant. In the second charging mode, the control unit 212 controls the secondary filter unit 211 to stop working, such that the output current of the second adapter 10 is the pulsating direct current.

In embodiments of the present disclosure, the control unit may control an operation of the secondary filter unit, such that the second adapter not only can output normal direct current with the constant value, but also can output pulsating direct current with the changing value, thus realizing compatibility with the charging mode in the related art.

In some embodiments, the second adapter 10 supports the second charging mode. The second charging mode may be a constant current mode. In the second charging mode, the output current of the second adapter is alternating current. The alternating current can also reduce the lithium precipitation of the lithium battery, improving service lifespan of the battery.

In some embodiments, the second adapter 10 supports the second charging mode. The second charging mode may be a constant current mode. In the second charging mode, the output voltage and the output current of the second adapter are directly applied to both ends of the battery in the device to be charged (such as the terminal) for performing direct charging on the battery.

In detail, the direct charging refers to that, the output voltage and the output current of the second adapter are directly applied to (or directed to) both ends of the battery in the device to be charged (such as the terminal) for charging the battery in the device to be charged (such as the terminal), and it is unnecessary to provide a conversion circuit to convert the output current or the output voltage of the second adapter, thus avoiding energy loss during the conversion. During the charging process in the second charging mode, in order to be able to adjust the charging voltage or the charging current on the charging circuit, the second adapter may be designed as an intelligent adapter, and the second adapter realizes the conversion of the charging voltage or the charging current, thus relieving burden of the device to be charged (such as the terminal) and reducing heat generated in the device to be charged. The constant current mode herein means a charging mode in which the output current of the second adapter is controlled, while it is not required to keep the output current of the second adapter constant. In practice, the second adapter typically adopts a multi-stage constant current mode for charging in the constant current mode.

The multi-stage constant current charging may include N charging stages, where N is an integer no less than 2. The first charging stage of the multi-stage constant current charging starts with predetermined charging current. N constant charging stages in the multi-stage constant current charging are performed in sequence from the first charging stage to the $(N-1)^{th}$ charging stage. When the charging proceeds to a next charging stage from one charging stage, the charging current value reduces. When the voltage of the battery reaches a charging stop voltage threshold, the charging proceeds to a next charging stage from one charging stage.

Figure 22:
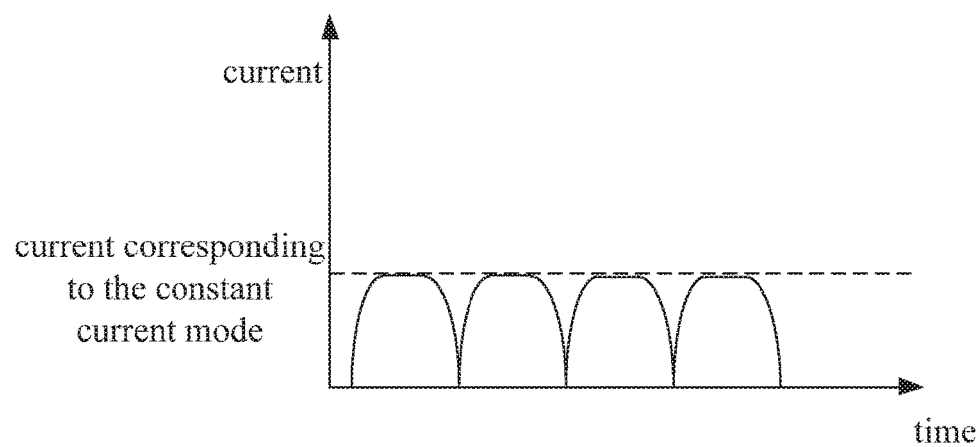
FIG. 22 is a schematic diagram illustrating a pulsating direct current in a constant current mode according to an embodiment of the present disclosure.

Further, when the output current of the second adapter is the pulsating direct current, the constant current mode may mean a charging mode in which the peak value or a mean value of the pulsating direct current is controlled, i.e., the peak value of the output current of the second adapter does not exceed a current value corresponding to the constant current mode, as illustrated in FIG. 22. In addition, in a case that the output current of the second adapter is the alternating current, the constant current mode may mean a charging mode in which a peak value of the alternating current is controlled.

Figure 23:
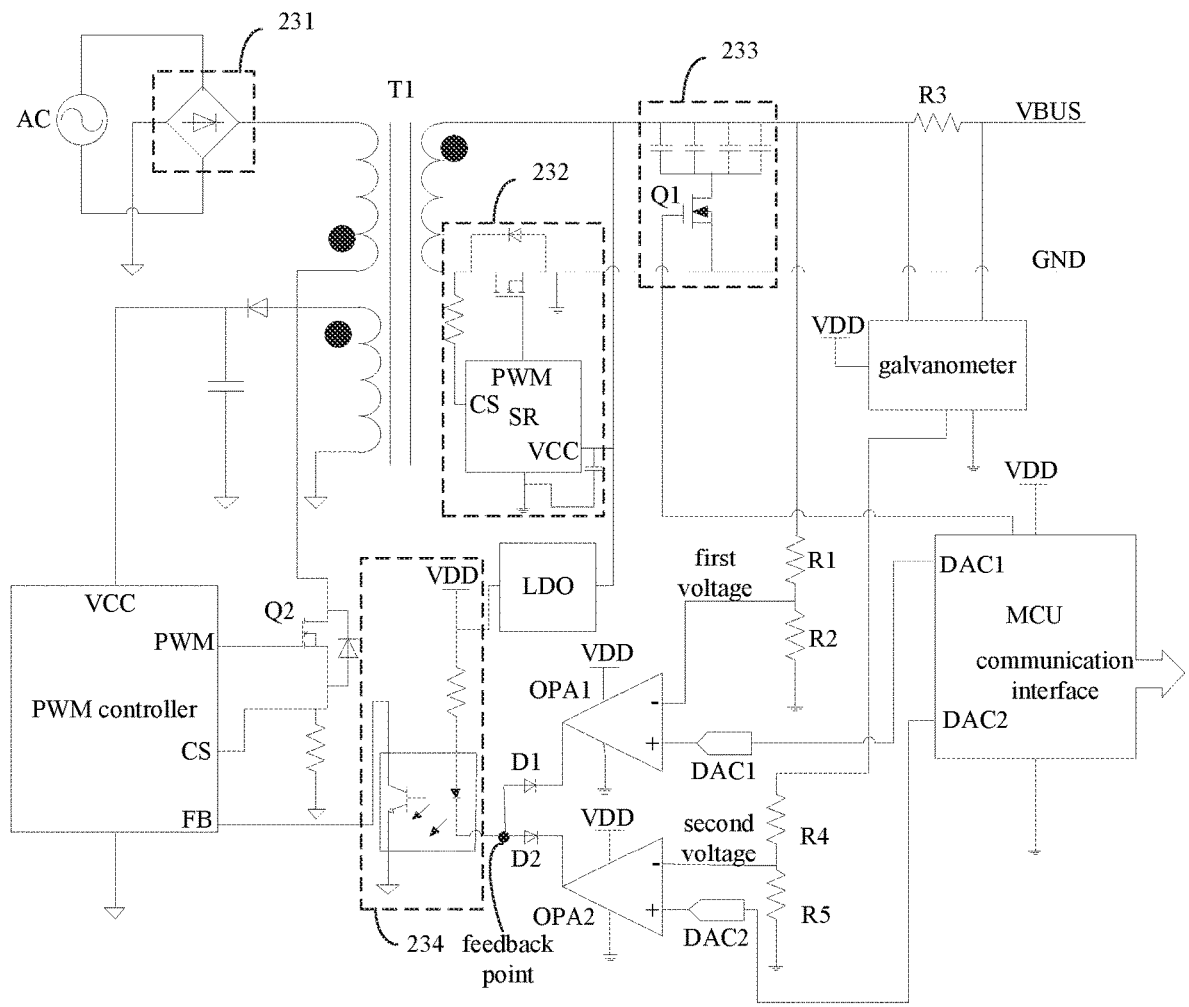
FIG. 23 is a schematic diagram illustrating a circuit of a second adapter according to an embodiment of the present disclosure.

The embodiments of the present disclosure will be described in detail with reference to specific examples. It should be noted that, examples illustrated in FIG. 23 are merely used to help those skilled in the related art to understand the embodiments of the present disclosure, rather than to limit the embodiments of the present disclosure to the illustrated specific numeric values or specific scenes. Apparently, various modifications and equivalents can be made by those skilled in the related art based on examples in FIG. 23, and those modifications and equivalents shall fall within the protection scope of the present disclosure.

The second adapter includes the power conversion unit (corresponding to the above-mentioned power conversion unit 11). As illustrated in FIG. 23, the power conversion unit may include an input end of the alternating current AC, a primary rectifier unit 231, a transformer T1, a secondary rectifier unit 232 and a secondary filter unit 233.

In detail, the input end of the alternating current introduces mains supply (typically alternating current of 220V), and the mains supply is transmitted to the primary rectifier unit 231.

The primary rectifier unit 231 is configured to convert the mains supply to first pulsating direct current, and the first pulsating direct current is transmitted to the transformer T1. The primary rectifier unit 38 may be a bridge rectifier unit, such as a full-bridge rectifier unit illustrated in FIG. 23, or may be a half-bridge rectifier unit, which is not limited herein.

In the related art, a primary side of an adapter includes a primary filter unit. The primary filter unit typically performs filtering based on the liquid aluminum electrolytic capacitor. A volume of the liquid aluminum electrolytic capacitor is large, which may lead to a large volume of the adapter. A primary side of the second adapter provide in embodiments of the present disclosure does not include the primary filter unit, so that the volume of the second adapter can be reduced to a great extent.

The transformer T1 is configured to couple the first pulsating direct current from a primary side of the transformer T1 to a secondary side of the transformer T1, to obtain second pulsating direct current, and the second pulsating direct current is output by a secondary winding of the transformer T1. The transformer T1 may be a normal transformer, or may be a high-frequency transformer of which a working frequency ranges from 50 KHz to 2 MHz. The number and connections of primary windings of the transformer T1 are related to a type of a switching power supply used in the second adapter, which are not limited herein. As illustrated in FIG. 23, the second adapter may adopt a flyback switching power supply. An end of the primary winding of the transformer is coupled to the primary rectifying unit 231, and the other end of the primary winding is coupled to a switch controlled by a PWM controller. Certainly, the second adapter may also adopt a forward switching power supply or a push-pull switching power supply. The primary rectifier unit and the transformer in switching power supplies with different type may have respective connections, which will be not described for simplicity.

The secondary rectifier unit 232 is configured to rectify the second pulsating direct current output by the secondary winding of the transformer T1, to obtain third pulsating direct current. The secondary rectifier unit 232 may be implemented in many types. FIG. 23 illustrates a typical type of secondary synchronous rectifier unit. The synchronous rectifier unit includes a synchronous rectifier (SR) chip, a metal oxide semiconductor (MOS) transistor controlled by the SR chip, and a diode coupled to a source electrode and a drain electrode of the MOS transistor. The SR chip sends a PWM control signal to a grid electrode of the MOS transistor, to control the MOS transistor to switch on or off, thus realizing a synchronous rectifying at the secondary side.

The secondary filter unit 233 is configured to filter the second pulsating direct current output by the secondary rectifying unit 232, to obtain the output voltage and the output current (i.e., voltage and current across the VBUS end and the GND end in FIG. 23) of the second adapter. In the embodiment illustrated in FIG. 23, a capacitor in the secondary filter unit 233 may adopt a solid capacitor or a solid capacitor in parallel with a normal capacitor (such as a ceramic capacitor) for filtering.

Further, the secondary filter unit 233 may include a switching unit, such as a switch transistor Q1 in FIG. 23. The switch transistor Q1 receives a control signal sent by a MCU. When the MCU controls the switch transistor Q1 to switch on, the secondary filter unit 233 works, such that the second adapter works in the first charging mode. In the first charging mode, the output voltage of the second adapter may be 5V, and the output current of the second adapter is stable direct current. When the MCU controls the switch transistor Q1 to switch off, the secondary filter unit 233 stops working, such that the second adapter works in the second charging mode. In the second charging mode, the second adapter directly outputs the pulsating direct current obtained after rectification in the secondary rectifier unit 232.

Further, the second adapter may include a voltage feedback unit (corresponding to the above-mentioned voltage feedback unit 12). As illustrated in FIG. 23, the voltage feedback unit may include a resistor R1, a resistor R2, and a first operational amplifier OPA1.

In detail, the resistor R1 and the resistor R2 sample the output voltage (i.e., voltage at VBUS) of the second adapter. A first voltage obtained by sampling is sent to an inverting input end of the OPA1, to indicate a size of the output voltage of the second adapter. An in-phase input end of the first operational amplifier OPA1 is coupled to DAC1 port of the MCU via the DAC1. The MCU adjusts a value of a reference voltage (corresponding to the above-mentioned first reference voltage) of the first operational amplifier OPA1 by controlling an analog quantity output by the DAC1, thus adjusting a value of the target voltage corresponding to the voltage feedback unit.

Further, the second adapter may include a current feedback unit (corresponding to the above-mentioned current feedback unit 13). As illustrated in FIG. 23, the current feedback unit may include a resistor R3, a galvanometer, a resistor R4, a resistor R5 and a second operational amplifier OPA2.

In detail, the resistor R3 is a current sensing resistor. The galvanometer obtains the output current of the second adapter by detecting current flowing through the resistor R3, and then the output current of the second adapter is converted to a corresponding voltage value and is output to two ends of the resistor R4 and the resistor R5 for voltage division, to obtain a second voltage. The second voltage may be configured to indicate a size of the output current of the second adapter. An inverting input end of the second operational amplifier OPA2 is configured to receive the second voltage. An in-phase input end of the second operational amplifier OPA2 is coupled to a DAC2 port of the MCU via the DAC2. The MCU adjusts a value of a reference voltage (corresponding to the above-mentioned second reference voltage) of the second operational amplifier OPA2 by controlling an analog quantity output by the DAC2, thus adjusting a value of the target current corresponding to the current feedback unit.

The second adapter may further include a power adjusting unit (corresponding to the above-mentioned power adjusting unit 14). As illustrated in FIG. 23, the power adjusting unit may include a first diode D1, a second diode D2, an optical coupling unit 234, a PWM controller, and a switch transistor Q2.

In detail, the first diode D1 and the second diode D2 are two diodes in reverse parallel. Anodes of the first diode D1 and the second diode D2 are coupled to a feedback point illustrated in FIG. 23. An input end of the optical coupling unit 234 is configured to receive a voltage signal of the feedback point. When a voltage at the feedback point is less than a working voltage VDD of the optical coupling unit 234, the optical coupling unit 234 starts to work, to provide feedback voltage to an FB end of the PWM controller. The PWM controller controls a duty ratio of a PWM signal output from a PWM end by comparing voltage at a CS end and voltage at the FB end. When a voltage signal (i.e. the above-mentioned voltage feedback signal) output by the first operation amplifier OPA1 is 0, or when a voltage signal (i.e. the above-mentioned current feedback signal) output by the second operation amplifier OPA2 is 0, the voltage at the FB end is stable, and the duty ratio of the PWM control signal output from the PWM end of the PWM controller keeps constant. The PWM end of the PWM controller is coupled to the primary winding of the transformer T1 via the switch transistor Q2, and configured to control the output voltage and the output current of the second adapter. When the duty ratio of the control signal sent from the PWM end is ascertained, the output voltage and the output current of the second adapter keep stable.

Further, the second adapter in FIG. 23 includes a first adjusting unit and a second adjusting unit. As illustrated in FIG. 23, the first adjusting unit includes a MCU (corresponding to above-mentioned control unit) and a DAC1. The first adjusting unit is configured to adjust a value of the reference voltage of the first operational amplifier OPA1, thus adjusting the value of the target voltage corresponding to the voltage feedback unit. The second adjusting unit includes a MCU (corresponding to above-mentioned control unit) and a DAC2. The second adjusting unit is configured to adjust a value of the reference voltage of the second operational amplifier OPA2, thus adjusting the value of the target current corresponding to the current feedback unit.

The MCU may adjust the value of the target voltage and the value of the target current according to a charging mode that the second adapter presently uses. For example, when the second adapter uses the constant voltage mode for charging, the target voltage may be adjusted to the voltage corresponding to the constant voltage mode, and the target current may be adjusted to the maximum current that the second adapter is able to output in the constant voltage mode. For another example, when the second adapter uses the current voltage mode for charging, the target current may be adjusted to the current corresponding to the current voltage mode, and the target voltage may be adjusted to the maximum voltage that the second adapter is able to output in the current voltage mode.

For example, in the constant voltage mode, the target voltage may be adjusted to a fixed value (such as 5V). Considering that the primary side is not provided with the primary filter unit (the primary filter unit adopts the liquid aluminum electrolytic capacitor with a large volume, and in order to reduce the volume of the second adapter, the primary filter unit is removed in embodiments of the present disclosure), and that the load capacity of the secondary filter unit 233 is limited, the target current may be set as 500 mA or 1 A. The second adapter firstly adjusts the output voltage to 5V based on the voltage feedback loop. Once the output current of the second adapter reaches the target current, the output current of the second adapter is controlled not to exceed the target current via the current feedback loop. In the constant current mode, the target current may be set as 4 A, and the target voltage is set as 5V. Since the output current of the second adapter is the pulsating direct current, a peak clipping is performed on current greater than 4 A via the current feedback loop, such that a peak value of the pulsating direct current keeps at 4 A. Once the output voltage of the second adapter exceeds the target voltage, the output voltage of the second adapter is controlled not to exceed the target voltage via the voltage feedback loop.

In addition, the MCU may further include a communication interface. The MCU can perform a bidirectional communication with the device to be charged (such as the terminal) via the communication interface, to control the charging process of the second adapter. For example, the charging interface is a USB interface, and the communication interface may also be the USB interface. In detail, the second adapter may use a power wire in the USB interface to charge the device to be charged (such as the terminal), and use a data wire (D+ and/or D−) in the USB interface to communicate with the device to be charged (such as the terminal).

In addition, the optical coupling unit 234 may be coupled to a voltage stabilizing unit, such that working voltage of the optical coupling unit keeps stable. As illustrated in FIG. 23, the voltage stabilizing unit in embodiments of the present disclosure may adopt a low dropout regulator (LDO).

In FIG. 23, as an example, the control unit (MCU) adjusts the reference voltage of the first operational amplifier OPA1 via the DAC1, which corresponds to the mode for adjusting reference voltage illustrated in FIG. 4. However, embodiments of the present disclosure are not limited thereto. Any one of modes for adjusting reference voltage illustrated in FIGS. 5-8 may be used, which are not elaborated herein for simplicity.

In FIG. 23, as an example, the control unit (MCU) adjusts the reference voltage of the second operational amplifier OPA2 via the DAC2, which corresponds to the mode for adjusting reference voltage illustrated in FIG. 12. However, embodiments of the present disclosure are not limited thereto. Any one of modes for adjusting reference voltage illustrated in FIGS. 13-16 may be used, which are not elaborated herein for simplicity.

The device embodiments of the present disclosure are described above in detail with reference to FIGS. 1-23. The method embodiments of the present disclosure will be described below in detail with reference to FIG. 24. It should be understood that, the description of method embodiments corresponds to the description of device embodiments, which are not elaborated herein for simplicity.

Figure 24:
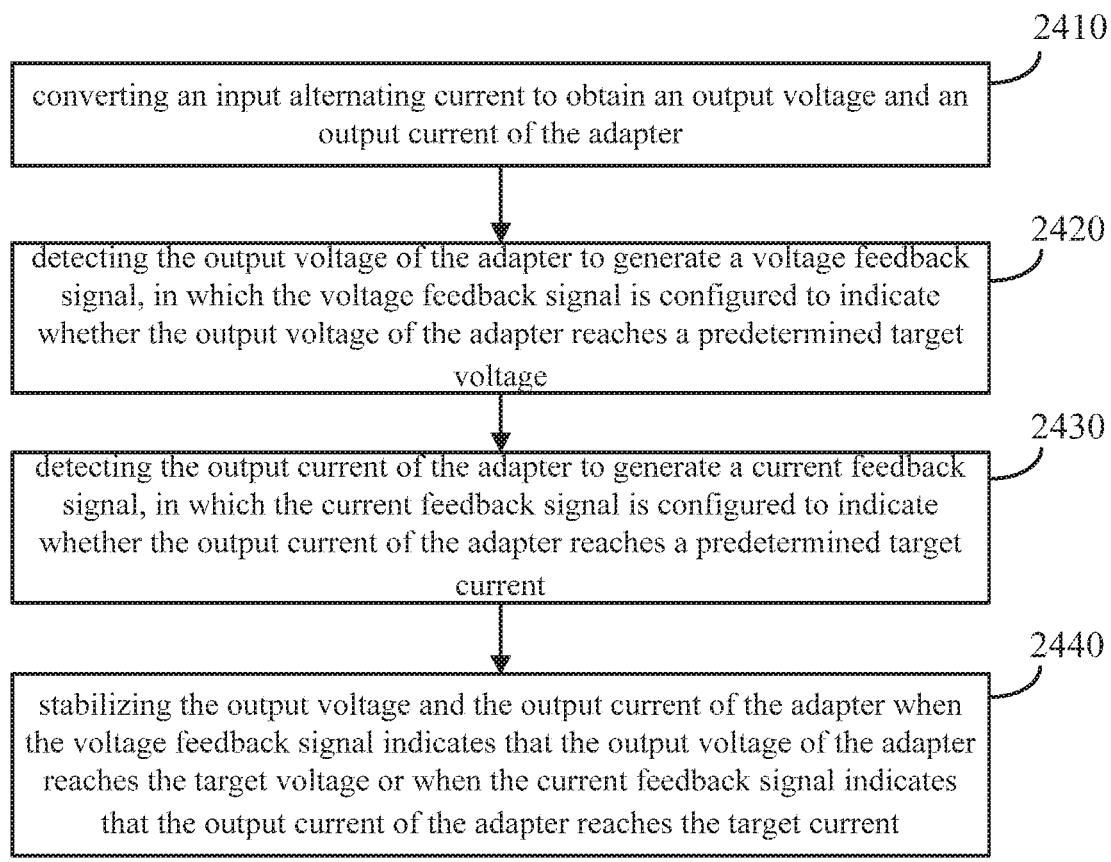
FIG. 24 is a flow chart of a charging control method according to an embodiment of the present disclosure.

FIG. 24 is a flow chart of a charging control method according to an embodiment of the present disclosure. The charging control method illustrated in FIG. 24 may be executed by the above-mentioned second adapter 10. The charging control method illustrated in FIG. 24 may include the following.

At block 2410, an input alternating current is converted to obtain an output voltage and an output current of the second adapter.

At block 2420, the output voltage of the second adapter is detected to generate a voltage feedback signal, in which the voltage feedback signal is configured to indicate whether the output voltage of the second adapter reaches a predetermined target voltage.

At block 2430, the output current of the second adapter is detected to generate a current feedback signal, in which the current feedback signal is configured to indicate whether the output current of the second adapter reaches a predetermined target current.

At block 2440, the output voltage and the output current of the second adapter is stabilized when the voltage feedback signal indicates that the output voltage of the second adapter reaches the target voltage or when the current feedback signal indicates that the output current of the second adapter reaches the target current.

In some embodiments, the second adapter supports a first charging mode. The first charging mode is a constant voltage mode. In the constant voltage mode, the target voltage is a voltage corresponding to the constant voltage mode, and the target current is a maximum current that the second adapter is able to output in the constant voltage mode. The charging control method illustrated in FIG. 24 may further include adjusting the output voltage of the second adapter to the voltage corresponding to the constant voltage mode according to the voltage feedback signal. The action at block 2440 may include controlling the output current of the second adapter not to exceed the maximum current that the second adapter is able to output in the constant voltage mode when the current feedback signal indicates that the output current of the second adapter reaches the maximum current that the second adapter is able to output in the constant voltage mode.

In some embodiments, the second adapter includes a primary rectifier unit, a transformer, a secondary rectifier unit, and a secondary filter unit. The primary rectifier unit directly outputs a voltage with a pulsating waveform to the transformer.

In some embodiments, the maximum current that the second adapter is able to output in the constant voltage mode is determined based on a capacitance of a capacitor in the secondary filter unit.

In some embodiments, the second adapter supports a second charging mode. The second charging mode is a constant current mode. In the constant current mode, the target voltage is a maximum voltage that the second adapter is able to output in the constant current mode, and the target current is a current corresponding to the constant current mode. The charging control method illustrated in FIG. 24 may further include adjusting the output current of the second adapter to the current corresponding to the constant current mode according to the current feedback signal. The action at block 2440 may include controlling the output voltage of the second adapter not to exceed the maximum voltage that the second adapter is able to output in the constant current mode when the voltage feedback signal indicates that the output voltage of the second adapter reaches the maximum voltage that the second adapter is able to output in the constant current mode.

In some embodiments, the charging control method illustrated in FIG. 24 may further include adjusting a value of the target voltage.

In some embodiments, the second adapter supports the first charging mode and the second charging mod. Adjusting the value of the target voltage may include adjusting the value of the target voltage based on the first charging mode or the second charging mode presently used by the second adapter.

In some embodiments, detecting the output voltage of the second adapter to generate the voltage feedback signal includes follows. The output voltage of the second adapter is sampled to obtain a first voltage. The first voltage is compared with a first reference voltage. The voltage feedback signal is generated based on a result of comparing the first voltage with the first reference voltage. Adjusting the value of the target voltage includes adjusting the value of the target voltage by adjusting the value of the first reference voltage.

In some embodiments, the value of the first reference voltage is adjusted based on a first DAC.

In some embodiments, the value of the first reference voltage is adjusted based on an RC filter unit.

In some embodiments, the value of the first reference voltage is adjusted based on a digital potentiometer.

In some embodiments, detecting the output voltage of the second adapter to generate the voltage feedback signal includes follows. Voltage division is performed on the output voltage of the second adapter according to a predetermined division ratio to generate a first voltage. The first voltage is compared with a first reference voltage. The voltage feedback signal is generated based on a result of comparing the first voltage with the first reference voltage. Adjusting the value of the target voltage includes adjusting the value of the target voltage by adjusting the division ratio.

In some embodiments, the division ratio is a division ratio of a digital potentiometer.

In some embodiments, the charging control method illustrated in FIG. 24 may further include adjusting a value of the target current.

In some embodiments, the second adapter supports the first charging mode and the second charging mod. Adjusting the value of the target current may include adjusting the value of the target current based on the first charging mode or the second charging mode presently used by the second adapter.

In some embodiments, detecting the output current of the second adapter to generate the current feedback signal includes follows. The output current of the second adapter is sampled to obtain a second voltage. The second voltage is configured to indicate a size of the output current of the second adapter. The second voltage is compared with a second reference voltage. The current feedback signal is generated based on a result of comparing the second voltage with the second reference voltage. Adjusting the value of the target current includes adjusting the value of the target current by adjusting the value of the second reference voltage.

In some embodiments, the value of the second reference voltage is adjusted based on a second DAC.

In some embodiments, the value of the second reference voltage is adjusted based on an RC filter unit.

In some embodiments, the value of the second reference voltage is adjusted based on a digital potentiometer.

In some embodiments, detecting the output current of the second adapter to generate the current feedback signal includes follows. The output current of the second adapter is sampled to obtain a third voltage. The third voltage is configured to indicate a size of the output current of the second adapter. Voltage division is performed on the third voltage according to a pre-determined division ratio to generate a second voltage. The second voltage is compared with a second reference voltage. The current feedback signal is generated based on a result of comparing the second voltage with the second reference voltage. Adjusting the value of the target current includes adjusting the value of the target current by adjusting the division ratio.

In some embodiments, the division ratio is a division ratio of a digital potentiometer.

In some embodiments, the second adapter supports a first charging mode and a second charging mode. A charging speed of the second adapter charging the device to be charged in the second charging mode is greater than a charging speed of the second adapter charging the device to be charged in the first charging mode. The charging control method illustrated in FIG. 24 may further include: during the second adapter is coupled to the device to be charged, performing bidirectional communication with the device to be charged to control an output of the second adapter in the second charging mode.

In some embodiments, performing the bidirectional communication with the device to be charged to control the output of the second adapter in the second charging mode may include: performing the bidirectional communication with the device to be charged to negotiate a charging mode between the second adapter and the device to be charged.

In some embodiments, performing the bidirectional communication with the device to be charged to negotiate the charging mode between the second adapter and the device to be charged may include: sending a first instruction to the device to be charged, in which the first instruction is configured to query the device to be charged whether to operate in the second charging mode; receiving a reply instruction of the first instruction sent by the device to be charged, in which the reply instruction of the first instruction is configured to indicate whether the device to be charged is able to operate in the second charging mode; and charging the device to be charged in the second charging mode when the device to be charged is able to operate in the second charging mode.

In some embodiments, performing the bidirectional communication with the device to be charged to control the output of the second adapter in the second charging mode may include: performing the bidirectional communication with the device to be charged to determine a charging voltage output by the second adapter in the second charging mode for charging the device to be charged; adjusting the value of the target voltage, such that the value of the target voltage is equal to the charging voltage output by the second adapter in the second charging mode for charging the device to be charged.

In some embodiments, performing the bidirectional communication with the device to be charged to determine the charging voltage output by the second adapter in the second charging mode for charging the device to be charged may include: sending a second instruction to the device to be charged, in which the second instruction is configured to query whether the output voltage of the second adapter matches with a present voltage of the battery; and receiving a reply instruction of the second instruction sent by the device to be charged, in which the reply instruction of the second instruction is configured to indicate that the output voltage of the second adapter matches with the present voltage of the battery, or is higher or lower than the present voltage of the battery.

In some embodiments, performing the bidirectional communication with the device to be charged to control the output of the second adapter in the second charging mode may include: performing the bidirectional communication with the device to be charged to determine a charging current output by the second adapter in the second charging mode for charging the device to be charged; adjusting the value of the target current, such that the value of the target current is equal to the charging current output by the second adapter in the second charging mode for charging the device to be charged.

In some embodiments, performing the bidirectional communication with the device to be charged to determine the charging current output by the second adapter in the second charging mode for charging the device to be charged may include: sending a third instruction to the device to be charged, in which the third instruction is configured to query a maximum charging current presently supported by the device to be charged; receiving a reply instruction of the third instruction sent by the device to be charged, in which the reply instruction of the third instruction is configured to indicate the maximum charging current presently supported by the device to be charged; and determining the charging current output by the second adapter in the second charging mode for charging the device to be charged according to the maximum charging current presently supported by the device to be charged.

In some embodiments, performing the bidirectional communication with the device to be charged to control the output of the second adapter in the second charging mode may include: during charging in the second charging mode, performing the bidirectional communication with the device to be charged to adjust the output current of the second adapter.

In some embodiments, performing the bidirectional communication with the device to be charged to adjust the output current of the second adapter may include: sending a fourth instruction to the device to be charged, in which the fourth instruction is configured to query the present voltage of the battery in the device to be charged; receiving a reply instruction of the fourth instruction sent by the device to be charged, in which the reply instruction of the fourth instruction is configured to indicate the present voltage of the battery; and adjusting the output current of the second adapter according to the present voltage of the battery.

In some embodiments, the second adapter includes a charging interface. The second adapter performs the bidirectional communication with the device to be charged via a data wire of the charging interface.

In some embodiments, the second adapter supports the second charging mode. The second charging mode is a constant current mode, and in the second charging mode, the output current of the second adapter is the pulsating direct current.

In some embodiments, the second adapter supports the first charging mode. The first charging mode is a constant voltage mode. The second adapter includes a secondary filter unit. The charging control method illustrated in FIG. 24 may further include: in the first charging mode, controlling the secondary filter unit to work, such that the value of the output voltage of the second adapter is constant; and in the second charging mode, controlling the secondary filter unit to stop working, such that the output current of the second adapter is the pulsating direct current.

In some embodiments, the second adapter supports the second charging mode. The second charging mode is a constant current mode, and in the second charging mode, the output current of the second adapter is the alternating current.

In some embodiments, the second adapter supports the second charging mode. In the second charging mode, the output voltage and the output current are directly applied to both ends of the battery in the device to be charged to perform direct charging on the battery.

In some embodiments, the second adapter is configured to charge a mobile device to be charged.

In some embodiments, the second adapter includes a control unit configured to control a charging process, and the control unit is a MCU.

In some embodiments, the second adapter includes a charging interface. The charging interface is a USB interface.

It is to be understood that, the first adapter and the second adapter herein are for convenience of description only and are not intended to limit particular types of the adapter in the embodiments of the present disclosure.

Those skilled in the art may be aware that, in combination with the examples described in the embodiments disclosed in this specification, units and algorithm steps can be implemented by electronic hardware, or a combination of computer software and electronic hardware. In order to clearly illustrate interchangeability of the hardware and software, components and steps of each example are already described in the description according to the function commonalities. Whether the functions are executed by hardware or software depends on particular applications and design constraint conditions of the technical solutions. Persons skilled in the art may use different methods to implement the described functions for each particular application, but it should not be considered that the implementation goes beyond the scope of the present invention.

Those skilled in the art may be aware that, with respect to the working process of the system, the device and the unit, reference is made to the part of description of the method embodiment for simple and convenience, which are described herein.

In embodiments of the present disclosure, it should be understood that, the disclosed system, device and method may be implemented in other way. For example, embodiments of the described device are merely exemplary. The partition of units is merely a logical function partitioning. There may be other partitioning ways in practice. For example, several units or components may be integrated into another system, or some features may be ignored or not implemented. Further, the coupling between each other or directly coupling or communication connection may be implemented via some interfaces. The indirect coupling or communication connection may be implemented in an electrical, mechanical or other manners.

In embodiments of the present disclosure, it should be understood that, the units illustrated as separate components can be or not be separated physically, and components described as units can be or not be physical units, i.e., can be located at one place, or can be distributed onto multiple network units. It is possible to select some or all of the units according to actual needs, for realizing the objective of embodiments of the present disclosure.

In addition, each functional unit in the present disclosure may be integrated in one progressing module, or each functional unit exists as an independent unit, or two or more functional units may be integrated in one module.

If the integrated module is embodied in software and sold or used as an independent product, it can be stored in the computer readable storage medium. Based on this, the technical solution of the present disclosure or a part making a contribution to the related art or a part of the technical solution may be embodied in a manner of software product. The computer software produce is stored in a storage medium, including some instructions for causing one computer device (such as a personal PC, a server, a second adapter, or a network device etc.) to execute all or some of steps of the method according to embodiments of the present disclosure. The above-mentioned storage medium may be a medium able to store program codes, such as, USB flash disk, mobile hard disk drive, read-only memory (ROM), random-access memory (RAM), a magnetic tape, a floppy disc, an optical data storage device, and the like.

Although explanatory embodiments have been illustrated and described, it would be appreciated by those skilled in the art that the above embodiments cannot be construed to limit the present disclosure, and changes, alternatives, and modifications can be made in the embodiments without departing from spirit, principles and scope of the present disclosure.

What is claimed is:
1. An adapter, comprising:
a power conversion unit, configured to convert an input alternating current to obtain an output voltage and an output current of the adapter;
a voltage feedback unit, wherein an input end of the voltage feedback unit is coupled to the power conversion unit, and the voltage feedback unit is configured to detect the output voltage of the adapter to generate a voltage feedback signal, in which the voltage feedback signal is configured to indicate whether the output voltage of the adapter reaches a predetermined target voltage;

a current feedback unit, wherein an input end of the current feedback unit is coupled to the power conversion unit, and the current feedback unit is configured to detect the output current of the adapter to generate a current feedback signal, wherein the current feedback signal is configured to indicate whether the output current of the adapter reaches a predetermined target current;

a power adjusting unit, wherein an input end of the power adjusting unit is coupled to an output end of the voltage feedback unit and an output end of the current feedback unit respectively, an output end of the power adjusting unit is coupled to the power conversion unit, the power adjusting unit is configured to receive the voltage feedback signal and the current feedback signal, and to stabilize the output voltage and the output current of the adapter when the voltage feedback signal indicates that the output voltage of the adapter reaches the target voltage or when the current feedback signal indicates that the output current of the adapter reaches the target current; and a charging interface, wherein the adapter is configured to perform a bidirectional communication with the device to be charged via a data wire of the charging interface to negotiate a charging mode between the adapter and the device to be charged;

wherein the voltage feedback unit comprises a first operational amplifier, an output end of the first operational amplifier of the voltage feedback unit is configured to output the voltage feedback signal, the current feedback unit comprises a second operational amplifier, an output end of the second operational amplifier of the current feedback unit is configured to output the current feedback signal;

the power adjusting unit comprises a first diode, a second diode, an optical coupling unit, and a pulse width modulation (PWM) control unit, wherein the output end of the first operational amplifier of the voltage feedback unit is coupled to a cathode of the first diode, an anode of the first diode is coupled to an input end of the optical coupling unit, the output end of the second operational amplifier of the current feedback unit is coupled to a cathode of the second diode, an anode of the second diode is coupled to the input end of the optical coupling unit, an output end of the optical coupling unit is coupled to an input end of the PWM control unit, and an output end of the PWM control unit is coupled to the power conversion unit.

2. The adapter according to claim 1, wherein the adapter further comprises a first adjusting unit, the first adjusting unit is coupled to the voltage feedback unit and configured to adjust a value of the target voltage.

3. The adapter according to claim 2, wherein the voltage feedback unit comprises:

a voltage sampling unit, wherein an input end of the voltage sampling unit is coupled to the power conversion unit, and the voltage sampling unit is configured to sample the output voltage of the adapter to obtain a first voltage;

a voltage comparing unit, wherein an input end of the voltage comparing unit is coupled to an output end of the voltage sampling unit, and the voltage comparing unit is configured to compare the first voltage with a first reference voltage, and to generate the voltage feedback signal based on a result of comparing the first voltage with the first reference voltage;

wherein, the first adjusting unit is coupled to the voltage comparing unit, and configured to provide the first reference voltage for the voltage comparing unit, and to adjust the value of the target voltage by adjusting a value of the first reference voltage.

4. The adapter according to claim 3, wherein the first adjusting unit comprises a control unit and a digital potentiometer, a control end of the digital potentiometer is coupled to the control unit, an output end of the digital potentiometer is coupled to the voltage comparing unit, the control unit is configured to adjust the value of the first reference voltage by adjusting a division ratio of the digital potentiometer.

5. The adapter according to claim 3, wherein the voltage comparing unit comprises a first operational amplifier, an inverting input end of the first operational amplifier of the voltage comparing unit is configured to receive the first voltage, an in-phase input end of the first operational amplifier of the voltage comparing unit is configured to receive the first reference voltage, and an output end of the first operational amplifier of the voltage comparing unit is configured to generate the voltage feedback signal.

6. The adapter according to claim 2, wherein the first adjusting unit is configured to adjust the value of the target voltage based on a first charging mode or a second charging mode presently used by the adapter, in which a charging speed of the adapter charging a device to be charged in the second charging mode is greater than a charging speed of the adapter charging the device to be charged in the first charging mode.

7. The adapter according to claim 1, wherein the adapter further comprises a second adjusting unit, the second adjusting unit is coupled to the current feedback unit and configured to adjust a value of the target current.

8. The adapter according to claim 7, wherein the current feedback unit comprises:

a current sampling unit, wherein an input end of the current sampling unit is coupled to the power conversion unit, and the current sampling unit is configured to sample the output current of the adapter to obtain a second voltage, in which the second voltage is configured to indicate a magnitude of the output current of the adapter;

a current comparing unit, wherein an input end of the current comparing unit is coupled to an output end of the current sampling unit, the current comparing unit is configured to compare the second voltage with a second reference voltage, and to generate the current feedback signal based on a result of comparing the second voltage with the second reference voltage;

wherein, the second adjusting unit is coupled to the current comparing unit, and configured to provide the second reference voltage for the current comparing unit, and to adjust the current value of the target current by adjusting a voltage value of the second reference voltage.

9. The adapter according to claim 8, wherein the second adjusting unit comprises a control unit and a second digital-analog convertor (DAC), an input end of the second DAC is coupled to the control unit, an output end of the second DAC is coupled to the current comparing unit, and the control unit is configured to adjust the voltage value of the second reference voltage via the second DAC.

10. The adapter according to claim 8, wherein the current comparing unit comprises a second operational amplifier, an inverting input end of the second operational amplifier of the current comparing unit is configured to receive the second voltage, an in-phase input end of the second operational amplifier of the current comparing unit is configured to receive the second reference voltage, and an output end of the second operational amplifier of the current comparing unit is configured to generate the current feedback signal.

11. The adapter according to claim 7, wherein the second adjusting unit is configured to adjust the current value of the target current based on a first charging mode or a second charging mode presently used by the adapter, in which a charging speed of the adapter charging a device to be charged in the second charging mode is greater than a charging speed of the adapter charging the device to be charged in the first charging mode.

12. The adapter according to claim 1, wherein the adapter supports a constant voltage charging mode, and in the constant voltage charging mode, the target voltage is a voltage corresponding to the constant voltage mode, and the target current is a maximum current being able to be output by the adapter in the constant voltage mode;

the power adjusting unit is configured to adjust the output voltage of the adapter to the voltage corresponding to the constant voltage mode according to the voltage feedback signal, and to control the output current of the adapter to be not greater than the maximum current being able to be output by the adapter in the constant voltage mode when the current feedback signal indicates that the output current of the adapter reaches the maximum current being able to be output by the adapter in the constant voltage mode.

13. The adapter according to claim 12, wherein the power conversion unit comprises a primary rectifier unit, a transformer, a secondary rectifier unit, and a secondary filter unit, the primary rectifier unit is configured to output a voltage with a pulsating waveform to the transformer directly.

14. The adapter according to claim 13, wherein the maximum current being able to be output by the adapter in the constant voltage mode is determined based on a capacity of a capacitor in the secondary filter unit.

15. The adapter according to claim 1, wherein the adapter supports a constant current charging mode, and in the constant current charging mode, the target voltage is a maximum voltage being able to be output by the adapter in the constant current mode, and the target current is a current corresponding to the constant current mode;

the power adjusting unit is configured to adjust the output current of the adapter to the current corresponding to the constant current mode according to the current feedback signal, and to control the output voltage of the adapter to be not greater than the maximum voltage being able to be output by the adapter in the constant current mode when the voltage feedback signal indicates that the output voltage of the adapter reaches the maximum voltage being able to be output by the adapter in the constant current mode.

16. The adapter according to claim 1, wherein the adapter comprises a control unit, the control unit is configured to perform a bidirectional communication with the device to be charged during the adapter is coupled to the device to be charged, so as to control an output of the adapter in the second charging mode.

* * * * *